United States Patent
Cairns et al.

(10) Patent No.: US 6,377,099 B1
(45) Date of Patent: Apr. 23, 2002

(54) STATIC CLOCK PULSE GENERATOR, SPATIAL LIGHT MODULATOR AND DISPLAY

(75) Inventors: Graham Andrew Cairns; Michael James Brownlow, both of Oxford (GB)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/464,155

(22) Filed: Dec. 16, 1999

(30) Foreign Application Priority Data

Dec. 22, 1998 (GB) .............................................. 9828510

(51) Int. Cl.[7] .............................................. H03K 3/037
(52) U.S. Cl. ........................................ 327/217; 327/291
(58) Field of Search ................................. 327/141, 142, 327/166, 170–176, 177, 215, 216, 217, 219, 261, 291, 292, 293

(56) References Cited

U.S. PATENT DOCUMENTS

| | | | |
|---|---|---|---|
| 4,295,055 A | 10/1981 | Takemoto et al. | 307/221 |
| 5,566,129 A | * 10/1996 | Nakashima et al. | 327/174 |
| 5,619,157 A | 4/1997 | Kumata et al. | 327/203 |
| 5,646,566 A | * 7/1997 | Ross, Jr. et al. | 327/217 |
| 5,691,740 A | 11/1997 | Onitsuka et al. | 345/96 |
| 5,790,626 A | 8/1998 | Johnson et al. | 377/69 |
| 5,952,859 A | * 9/1999 | Kim et al. | 327/200 |

FOREIGN PATENT DOCUMENTS

| | | |
|---|---|---|
| EP | 0875881 | 4/1998 |
| JP | 9153296 | 10/1997 |

OTHER PUBLICATIONS

European Search Report, Application No. EP 99 31 0422, dated Apr. 5, 2000.

* cited by examiner

Primary Examiner—My-Trang Nu Ton
(74) Attorney, Agent, or Firm—Renner, Otto, Boisselle & Sklar, LLP

(57) ABSTRACT

A static clock pulse generator comprises a plurality of stages, each of which comprises a reset-set flip-flop and a gating circuit. Complementary outputs of the flip-flop control the gating circuit for supplying clock pulses from a clock input to the output of the stage. When the gating circuit is switched off, it holds the output at a default level. The flip-flop has a set input which receives the output from the preceding stage and a reset input which receives the output from the following stage.

38 Claims, 41 Drawing Sheets

STATIC CLOCK PULSE GENERATOR, SPATIAL LIGHT MODULATOR AND DISPLAY

The present invention relates to a static clock pulse generator. Such a generator may be used in high speed low power controller circuits, for instance in complex very large scale integrated (VLSI) designs including digital signal processing (DSP). The clock pulse generator may advantageously be used in addressing for driver circuits of spatial light modulators and displays, for example of the pixelated matrix type in which a sequence of well-defined pulses must be supplied to circuits which sample high speed video data.

A known type of clock pulse generator is based on a shift register. The shift register comprises a cascaded chain of D-type flip-flops which respond to clock pulses to pass a single stored logic state from one flip-flop to the next in the chain. For a typical clock pulse generation application, all but one of the states of the flip-flops are initialised to a logic low (0) state whereas the remaining flip-flop is initialised to a logic high (1) state. The shift register is clocked at a known frequency and the circulating 1 state within the shift register is used to generate sequential pulses at the outputs of the flip-flops. This well-known technique is disclosed, for example, in U.S. Pat. No. 4,542,301 and U.S. Pat. No. 4,612,659. An improvement to this technique is disclosed in U.S. Pat. No. 4,785,297. In this case, the "master" and "slave" outputs of each of the flip-flops are used in conjunction with combinational logic gates, such as AND or NAND gates, to reduce the clocking speed of the shift register for a given number of output pulses.

It is also well-known to form clock pulse generating circuits from chained D-type latch circuits. FIG. 1 of the accompanying drawings illustrates part of a typical CMOS circuit comprising latches 1 and 2. The construction and operation of such an arrangement is well-known and will not be described in detail. Consecutive latches such as 1 and 2 are transparent on opposite clock phases of a two phase clock represented by CK and CK-. The input and output of each latch are "NANDed" together in order to produce the clock pulses Nn And Np as illustrated in FIG. 2 of the accompanying drawings. FIG. 2 also illustrates the two phase clock waveforms, the D input to the first latch 1, the output M of the first latch 1 which is also the input of the second latch 2, and the output Q of the second latch 2.

A disadvantage of this arrangement is that the output pulses Nn and Np cannot be guaranteed to be non-overlapping. This can cause problems in certain applications, for example when the output pulses are used for sampling video data in pixel matrix display drivers.

Various techniques have been disclosed for reducing the capacitive loading of the clock line or lines so as to increase the maximum frequency of operation and reduce clock power consumption. For example, state-controlled clocking techniques have been suggested for use in clock pulse generating circuits. An example of this is disclosed in U.S. Pat. No. 4,746,915, in which the shift register is divided into several sub-registers of flip-flops or latches and another shift register operating at a lower frequency is used selectively to apply the clock signal to each sub-register.

For applications in which the requirement is for a single circulating 1 state, only those flip-flops or latches containing a 1 state or having a 1 state at their input require clocking. As shown in FIG. 3, for such applications, the signal generated by "ORing" the input and output of each flip-flop can be used to gate the clock signals supplied to the clock input of the flip-flop. Such an arrangement is disclosed in U.S. Pat. No. 5,128,974. However, such an arrangement requires a full flip-flop and several further transistors per stage. Also, the flip-flop outputs have to drive a relatively large load and this limits the maximum speed of operation.

The term "pass gate" as used herein is defined to mean a semiconductor arrangement having a main conduction path which can be controlled to transmit or block the passage of an input signal.

According to a first aspect of the invention, there is provided a static clock pulse generator comprising a clock input and N stages, characterised in that each ith one of the stages comprises a reset-set flip-flop having a set input for receiving a set signal from a gating circuit output of the (i−1)th stage and a reset input for receiving a reset signal from an (i+a)th stage, where a is greater than or equal to one, and a gating circuit for passing a clock pulse from the clock input to an output of the gating circuit when the flip-flop is set, where $1 < 1 \leq (N-a)$.

The gating circuit may be arranged to hold the output of the gating circuit at an inactive state when the flip-flop is reset.

The reset input of the flip-flop of each ith stage may be arranged to receive the reset signal from an output of the flip-flop of the (i+2)th stage.

The reset input of the flip-flop of each ith stage may be arranged to receive the reset signal from the output of the gating circuit of the (i+1)th stage.

The output of the gating circuit of each ith stage may be connected to the set input of the flip-flop of the (i+1)th stage via a delay circuit. Each delay circuit may comprise a plurality of cascade-connected inverters.

The generator may comprise a first stage comprising a reset-set flip-flop having a set input for receiving a start pulse and a reset input for receiving a reset signal from the (1+a)th stage, and a gating circuit for passing a clock pulse from the clock input to the second stage when the flip-flop is set.

The generator may comprise an Nth stage comprising a reset-set flip-flop having a set input for receiving a set signal from the gating circuit output of the (N−1)th stage and a reset input, and a gating circuit for passing a clock pulse from the clock input to the reset inputs of the flip-flops of the Nth and (N−1)th stages.

Each ith stage may comprise a first switching arrangement for selectively causing the flip-flop set input to receive a set signal from the gating circuit of the (i+1)th stage and the flip-flop reset input to receive a reset signal from the (i−a)th stage.

The first stage may comprise a second switching arrangement for selectively causing the flip-flop set input to receive a set input signal from the gating circuit output of the second stage and the flip-flop reset input to receive a clock pulse from the gating circuit of the first stage.

The Nth stage may comprise a third switching arrangement for selectively causing the flip-flop set input to receive a start pulse and the flip-flop reset input to receive a reset signal from the (1+a)th stage.

At least some of the gating circuit outputs may constitute outputs of the generator.

At least some of the outputs of the flip-flops may constitute outputs of the generator.

The gating circuits may have inputs connected to the clock input.

Each of the gating circuits may comprise a pass gate and a holding device for holding the output of the pass gate at an inactive state when the flip-flop is reset.

Each of the pass gates may be a transmission gate comprising opposite conductivity metal-oxide-silicon field effect transistors whose source-drain paths are connected in antiparallel and whose gates are connected to direct and complementary outputs of the flip-flop.

The clock input may be a two phase input. The pass gates of consecutive stages may be connected to different clock input phases. The clock pulses passed by the pass gates of the stages may be of the same polarity.

The holding device of each stage may comprise a pull-down transistor whose control electrode is connected to a or the complementary output of the flip-flop.

The holding device of each stage may comprise a pull-up transistor whose control electrode is connected to a or the direct output of the flip-flop.

The clock input may be a single phase clock input. The clock pulses passed by the pass gates of consecutive stages may be of opposite polarity. The holding devices of the stages may comprise alternating pull-down and pull-up transistors, the control electrode of each pull-down transistor being connected to the complementary output of the associated flip-flop and the control electrode of each pull-up transistor being connected to the direct output of the associated flip-flop.

Each of the gating circuits may comprise a gated sense amplifier.

Each of the gating circuits may comprise a gated level shifter.

Each of the flip-flops may comprise: a first inverter, at least one of whose input and output constitutes an output of the flip-flop; a second controllable inverter, whose input and output are connected to the output and input, respectively, of the first inverter; and an input circuit having first and second inputs constituting inputs of the flip-flop, the input circuit being arranged to supply to the input of the first inverter a signal corresponding to the states of the first and second inputs and to control the second inverter so as to switch the output of the second inverter to a high impedance state when the first or second input receives an active signal.

The first input may be an active high input and the second input may be an active low input. The input circuit may comprise: a first active device connected between a first power supply input and the input of the first inverter and having a control electrode constituting the second input; and a second active device, of opposite conduction type to the first active device, connected between a second power supply input and the input of the first inverter and having a control electrode constituting the first input. Each of the first and second active devices may be connected in an inverting configuration.

The second inverter may comprise third and fourth active devices of a first conduction type connected in series between a or the first power supply input and the output of the second inverter and fifth and sixth active devices of a second conduction type opposite the first type connected in series between a or the second power supply input and the output of the second inverter, the third and fifth active devices having control electrodes connected to the input of the second inverter and the fourth and sixth active devices having control electrodes connected to first and second inputs, respectively, of the input circuit. The control electrode of at least one of the third and fifth active devices may be connected to the input of the second inverter via a further active device. The or each further active device may have a control electrode connected to the first or second power supply input.

The first inverter may comprise a seventh active device connected between a or the first power supply input and the output of the first inverter and an eighth active device, of opposite conduction type to the seventh active device, connected between a or the second power supply input and the output of the first inverter, the seventh and eighth active devices having control electrodes connected to the input of the first inverter.

The generator may comprise a CMOS integrated circuit.

According to a second aspect of the invention, there is provided a spatial light modulator comprising a generator according to the first aspect of the invention.

The modulator may comprise a liquid crystal device.

According to a third aspect of the invention, there is provided a display comprising a modulator according to the second aspect of the invention.

It is thus possible to provide a clock pulse generator which is fully static. Such a generator is robust to capacitive interference and charge leakage and can operate at very low frequencies.

It is also possible to provide a clock pulse generator having a very high maximum frequency of operation. In particular, it is possible to provide a generator in which the clock pulses are required to charge only two transistor gates at a time (in addition to any external load when the gating circuit outputs constitute the outputs of the generator). Also, the clock signal can be fully gated. This is important for two reasons. Firstly, transistor loading of the clock signal limits its rise and fall times and hence the maximum frequency. With the present arrangement, loading of the clock is mainly due to parasitic elements so that high speed can be maintained for relatively large clock pulse generators.

Secondly, the capacitive loading of the clock signal by transistor gates can be minimised. In particular, only the gates of transistors in stages which are in their switching state are charged. This results in reduced power dissipation in the track resistance of circuit tracks carrying the clock signal.

The output pulses may be exact copies of the clock signal (degraded only by passage through the gating circuits). The gating circuits may be embodied as pass gates, which may be made relatively large so that the drive capability is high. The output pulses when taken from the pass gates are guaranteed to be non-overlapping.

Although some embodiments require a two phase clock, others require only a single phase clock.

A variety of useful signals may be generated from each pair of consecutive stages and these include:

(i) Independent non-overlapping (positive or negative) pulses of duration substantially equal to the clock pulse high period and synchronised with the clock rising edge;

(ii) Independent non-overlapping (positive or negative) pulses of duration substantially equal to the clock low period and synchronised to the clock falling edge;

(iii) Independent overlapping positive and negative pulses of duration substantially equal to the clock period and synchronised to the clock rising edge;

(iv) Independent overlapping positive and negative pulses of duration substantially equal to the clock period and synchronised to the clock falling edge.

In the case of the non-overlapping pulses, the relative pulse widths may be changed merely by changing the mark-to-space ratio of the clock signal used to drive the clock pulse generator.

In some embodiments, voltage level shifting can be provided. In particular, the clock signal may be of lower voltage than the generator supply voltage so that a reduction in power consumption can be achieved. In some of these embodiments, the output pulses may have amplitudes corresponding to substantially the whole supply voltage despite operating with clock signals of substantially lower amplitude. Also, in some embodiments, the generator can operate selectively in either direction ("forward" or "reverse"). This is advantageous in some applications, such as display driving in which the displayed image may need to be spatially inverted.

The invention will be further described, byway of example, with reference to the accompanying drawings, in which.

Figure 32:
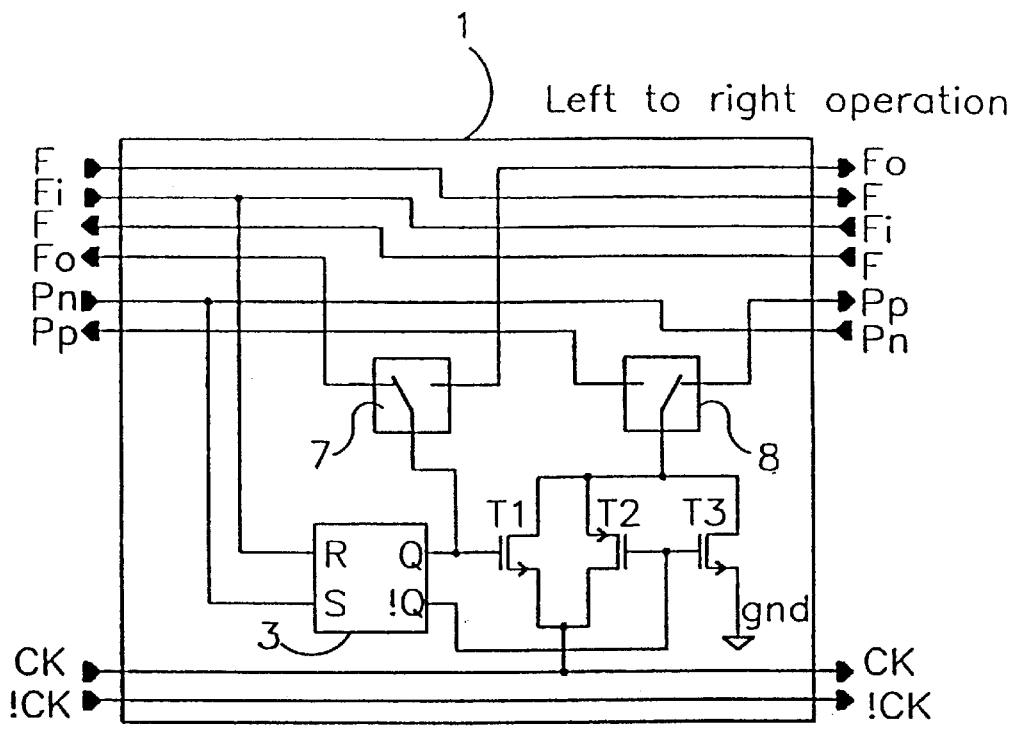
Figure 32:
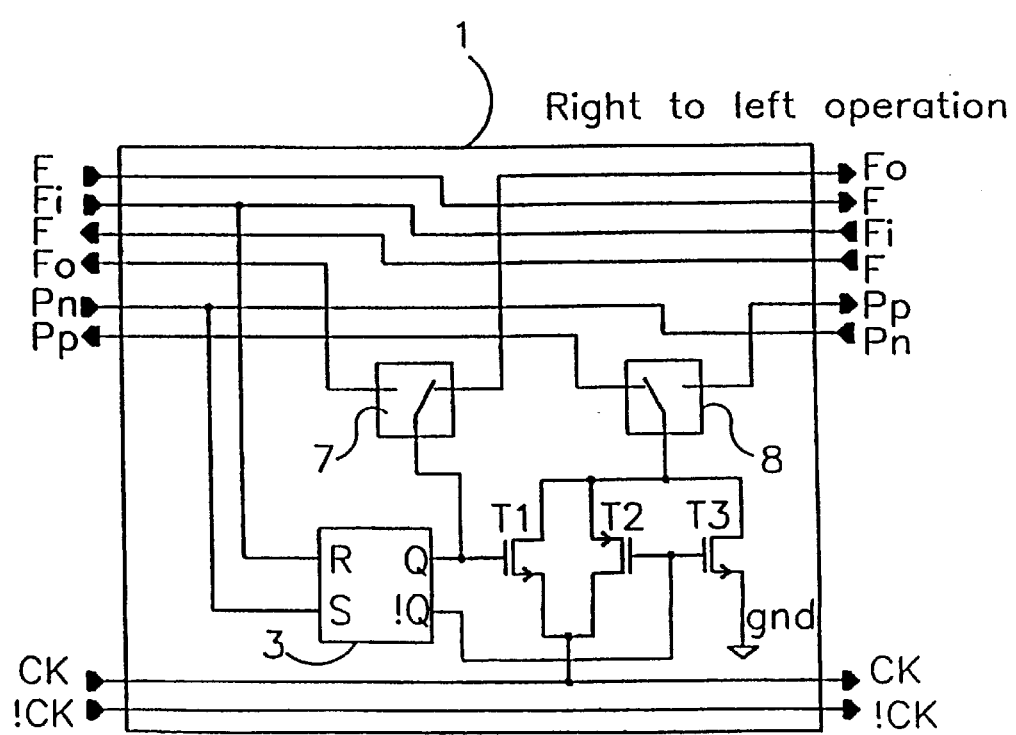
Figure 33:
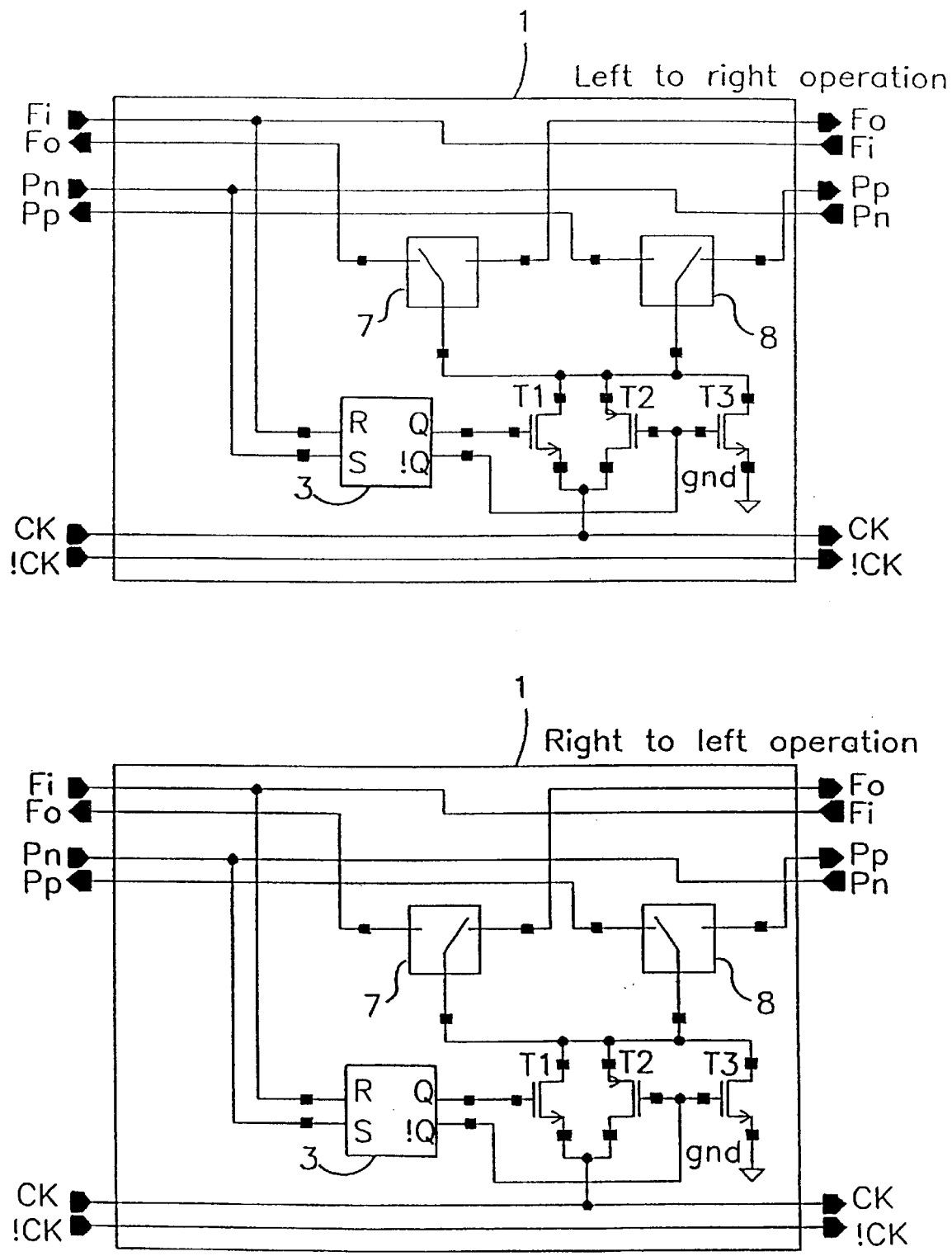
Figure 34:
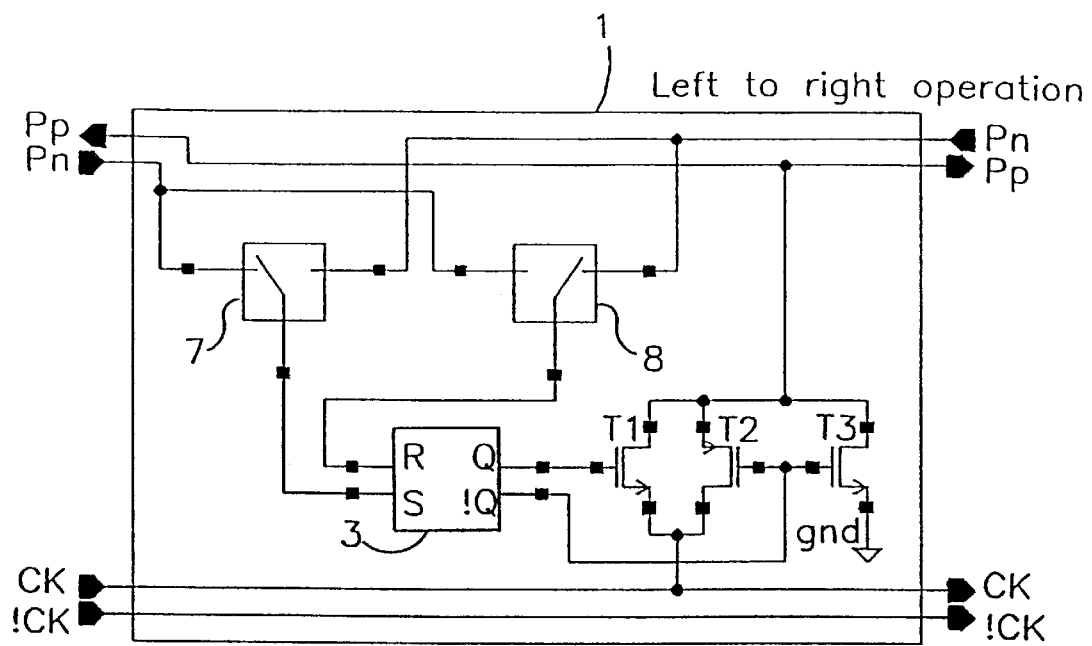
Figure 34:
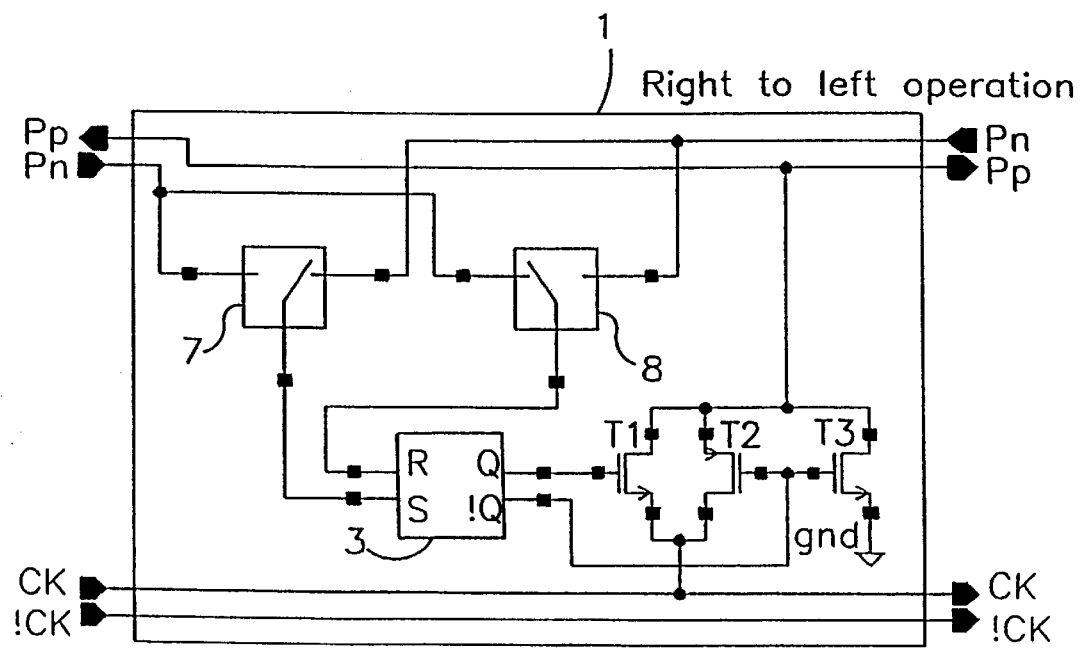
Figure 35:
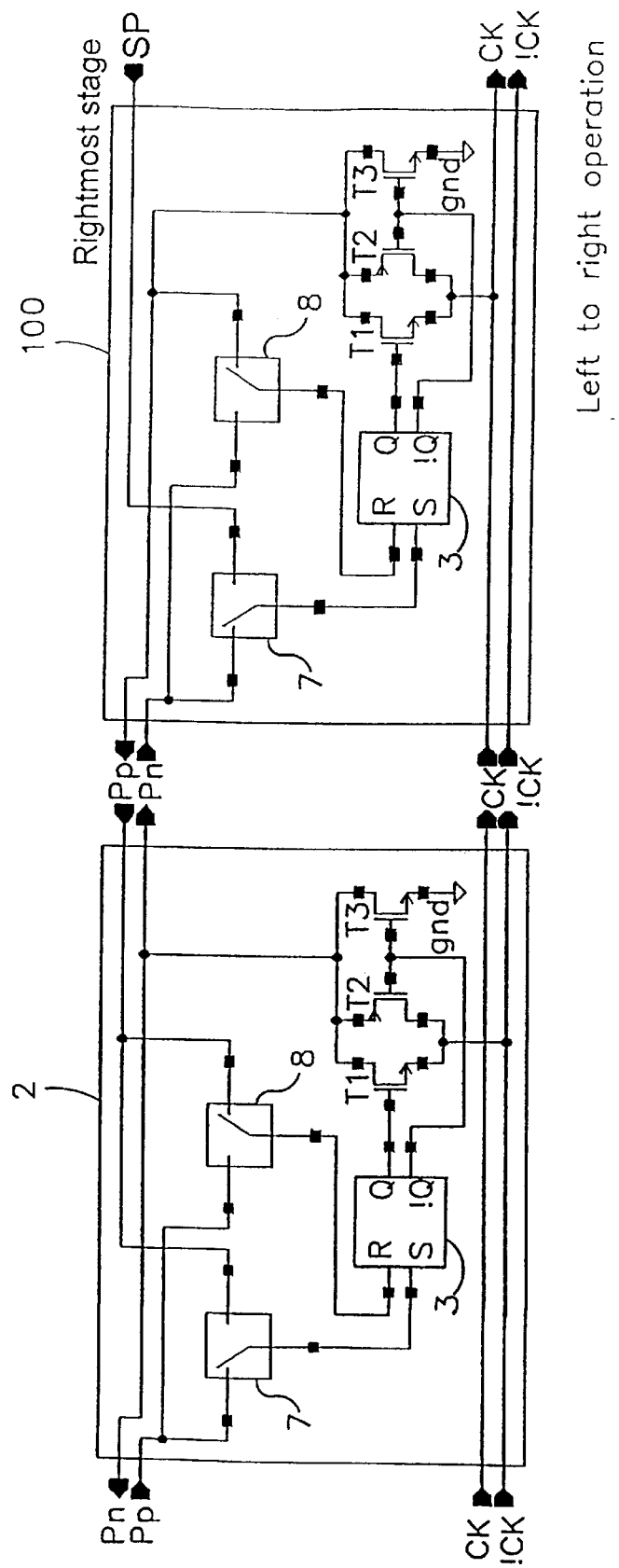
Figure 36:
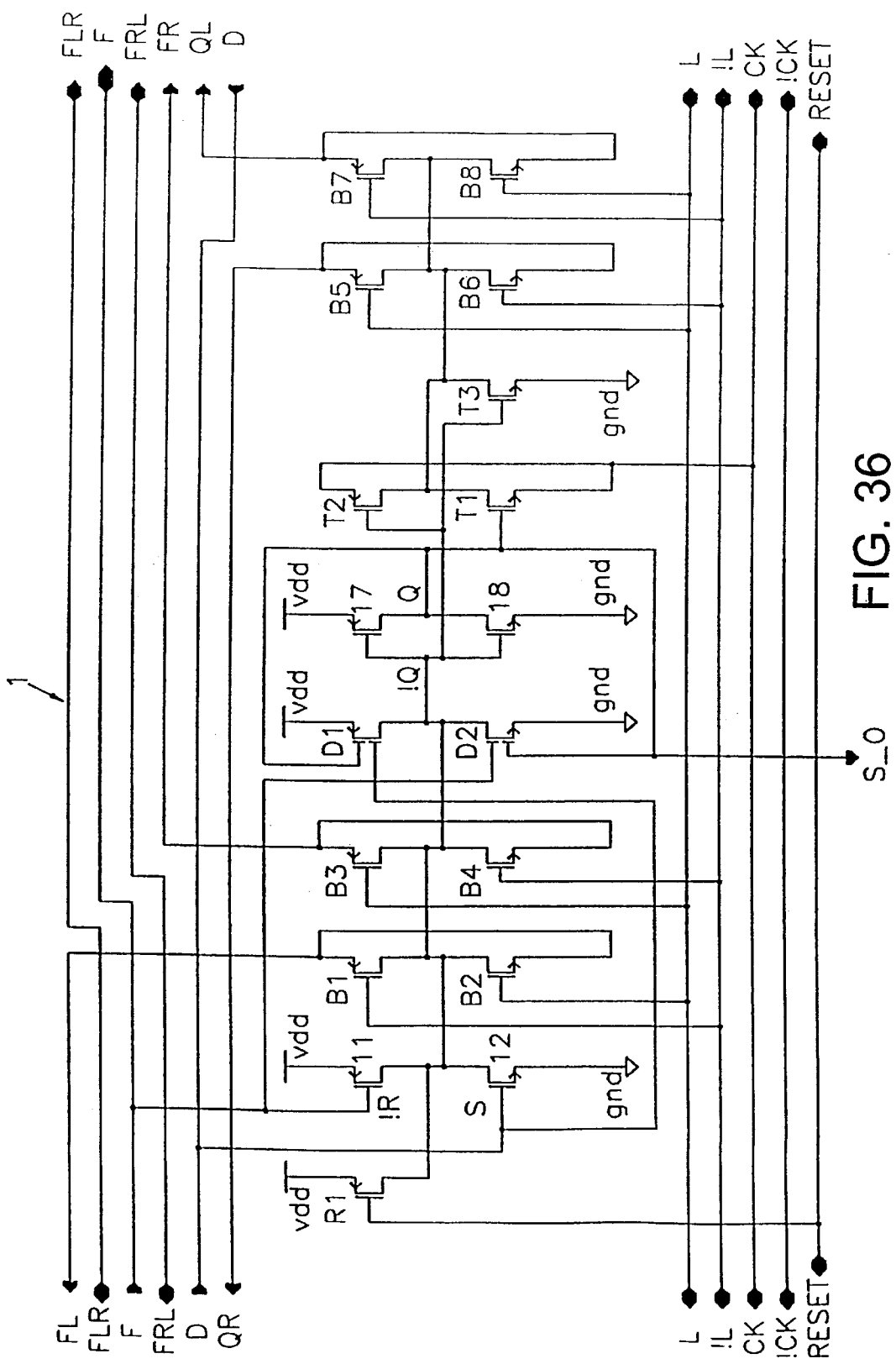
Figure 37:
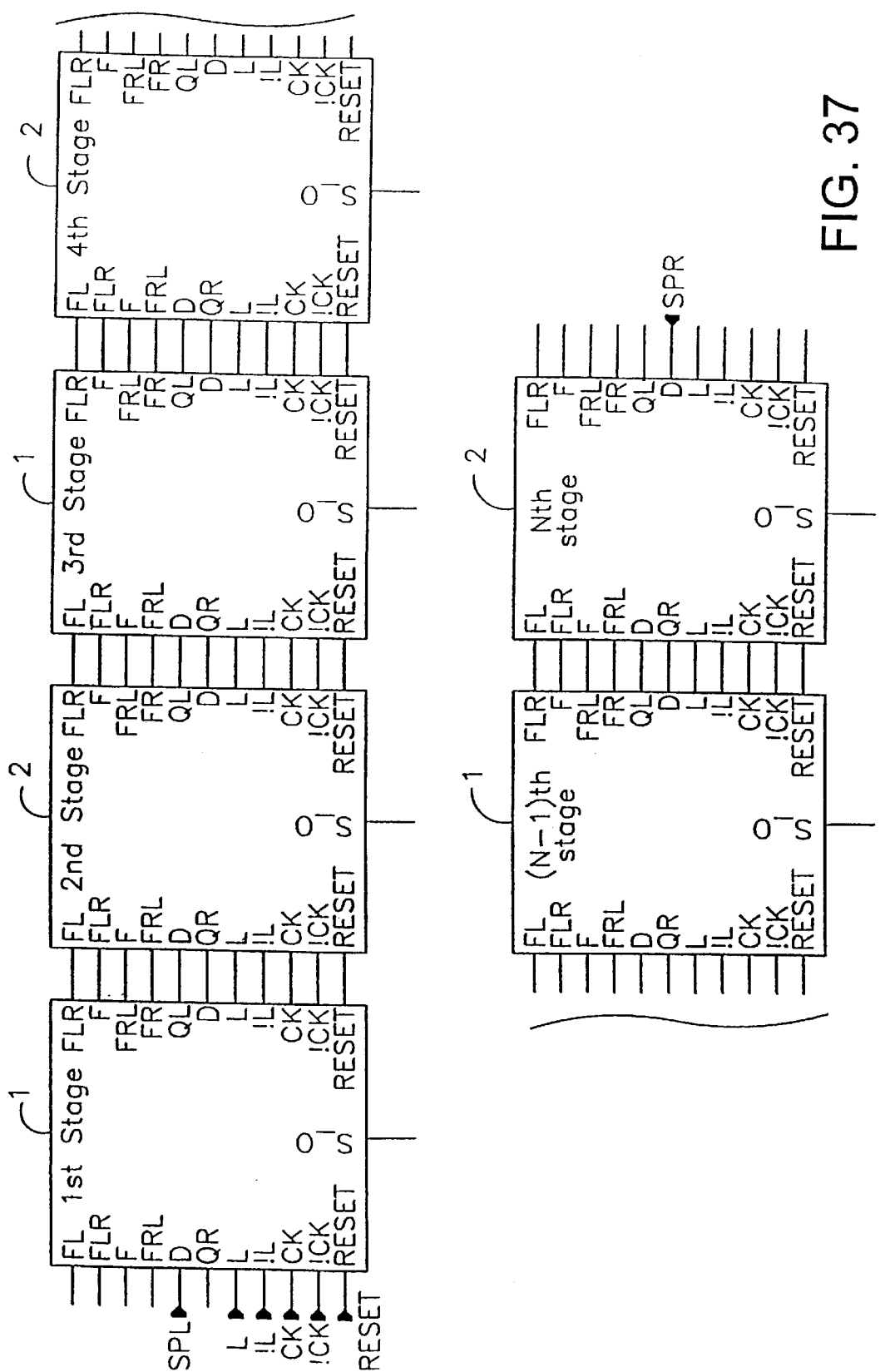
Figure 38:
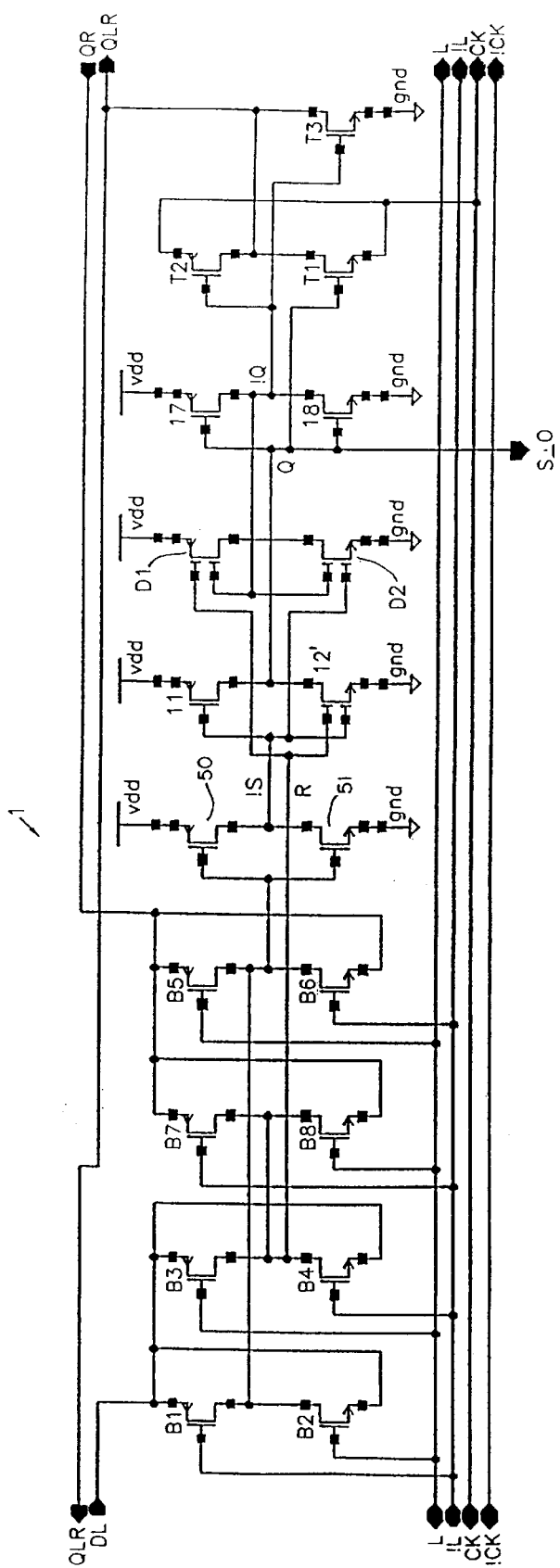
Figure 39A:
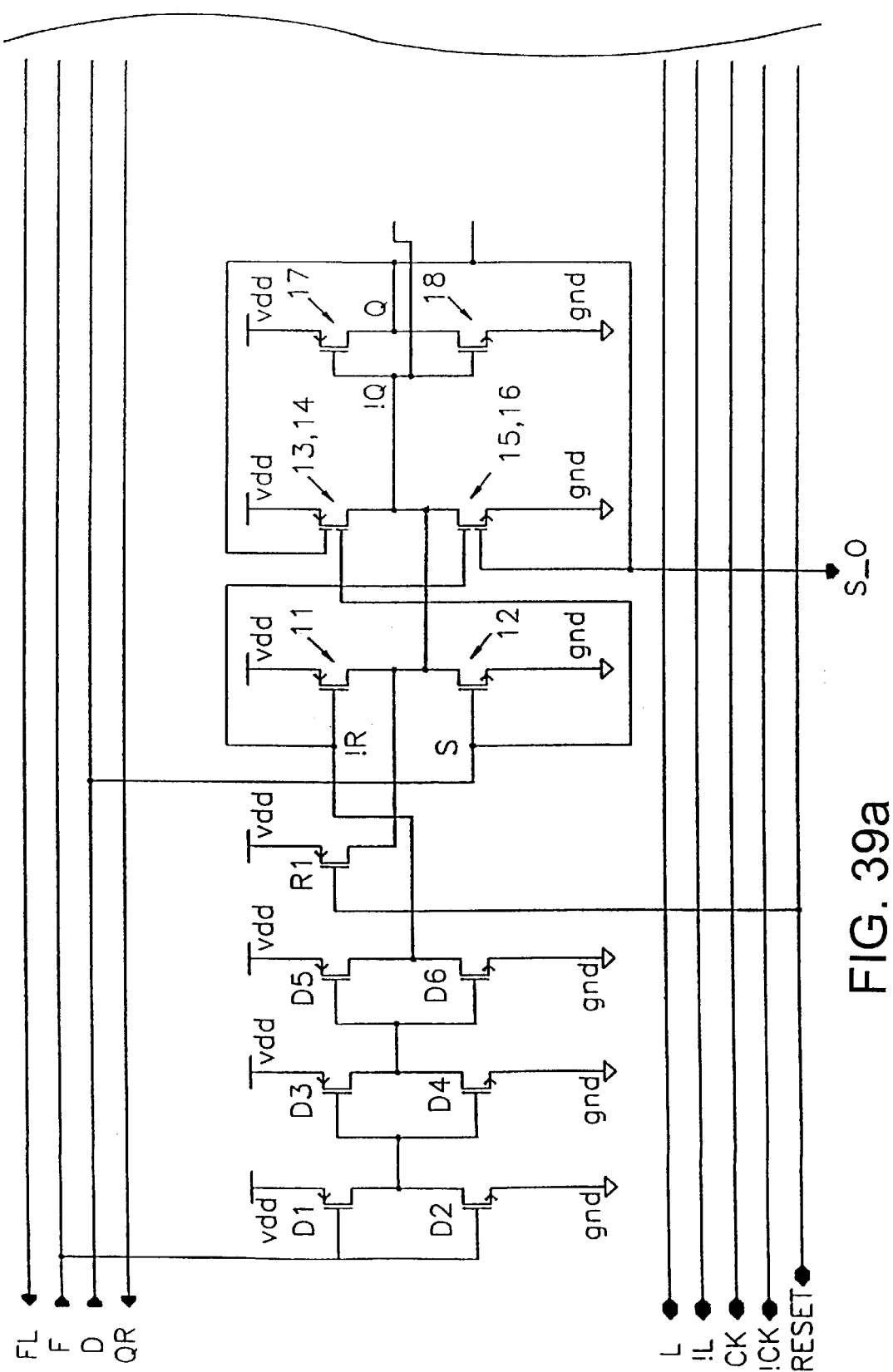
Figure 39B:
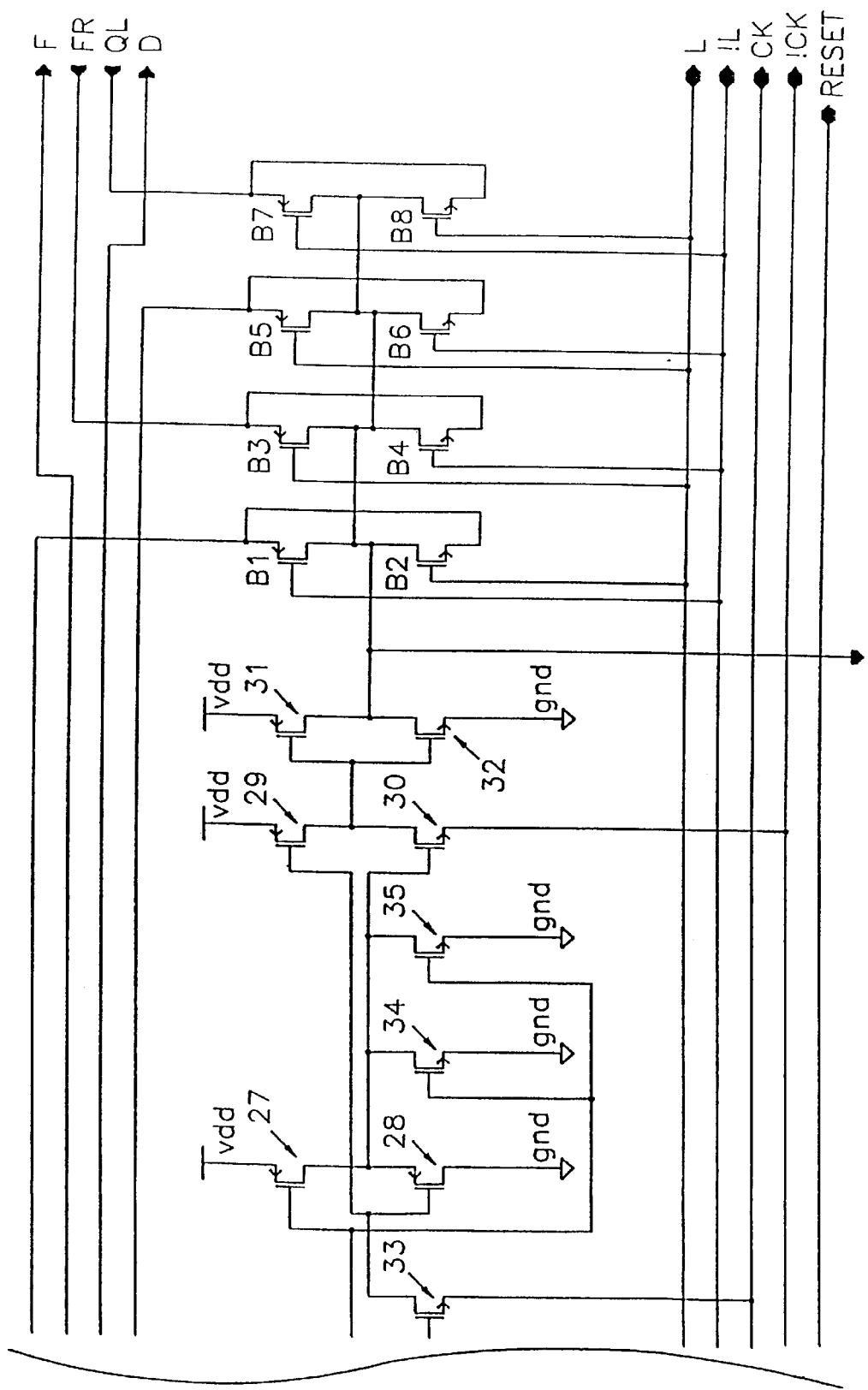
Figure 40:
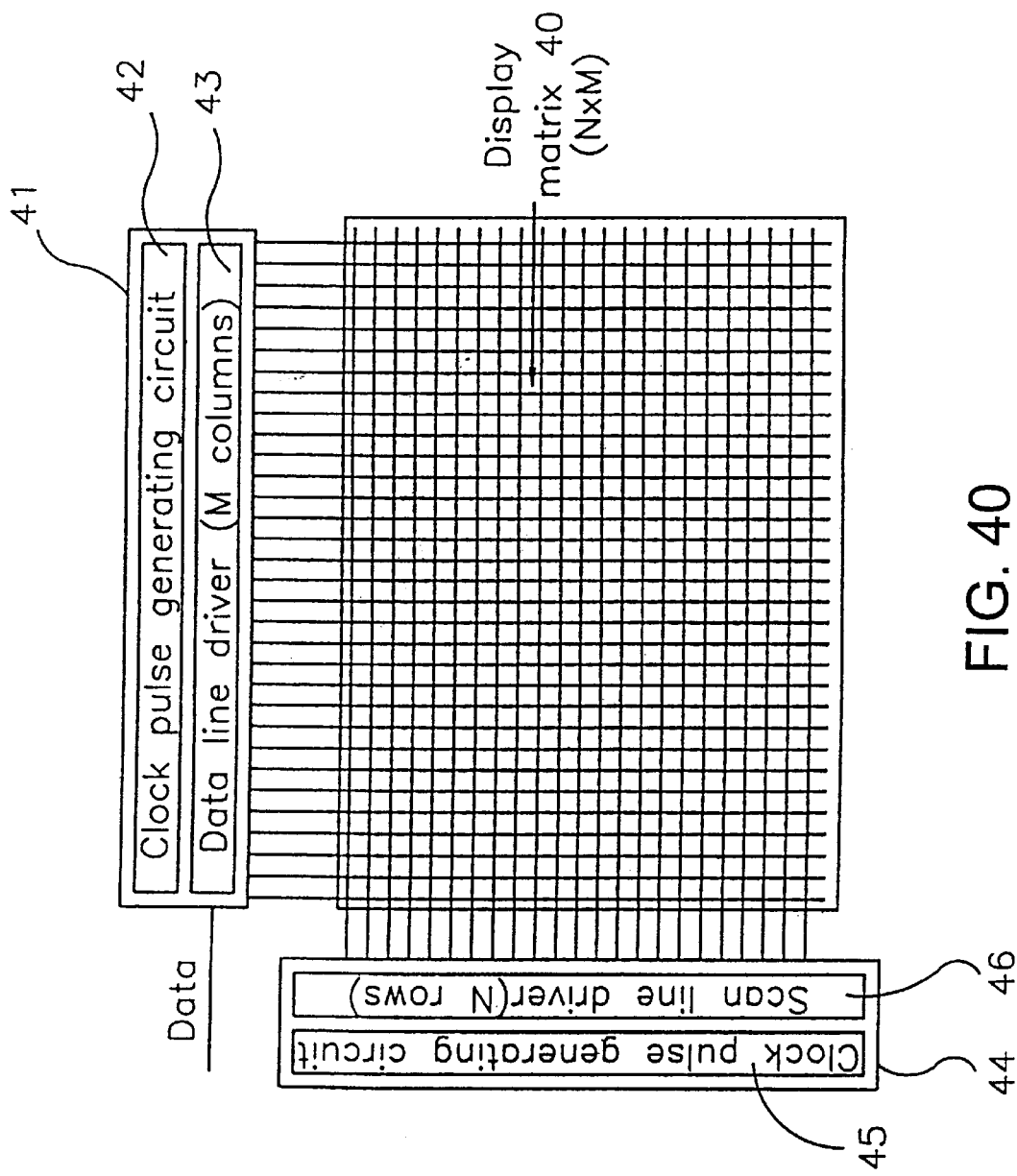

FIG. 32 comprises circuit diagrams of one stage of a bi-directional static clock pulse generator constituting an embodiment of the invention;

FIG. 33 comprises circuit diagrams of one stage of a bi-directional static clock pulse generator constituting an embodiment of the Inventors;

FIG. 34 comprises circuit diagrams of one stage of a bi-directional static clock pulse generator constituting an embodiment of the invention;

FIG. 35 is a circuit diagram of a penultimate stage of the type shown in FIG. 34 and an end or terminal stage of a bi-directional static clock pulse generator constituting an embodiment of the invention;

FIG. 36 is a more detailed circuit diagram of a bi-directional stage similar to that shown in FIG. 32;

FIG. 37 is a block diagram of the clock pulse generator, one of whose stages is shown in FIG. 36;

FIG. 38 is a circuit diagram of one stage of another bi-directional static clock pulse generator constituting an embodiment of the invention;

FIGS. 39a and 39b are a circuit diagram of one stage of a further bi-directional static pulse generator constituting an embodiment of the invention; and FIG. 40 is a block schematic diagram of a spatial light modulator constituting an embodiment of the invention.

Like reference numerals refer to like parts throughout the drawings.

Figure 1:
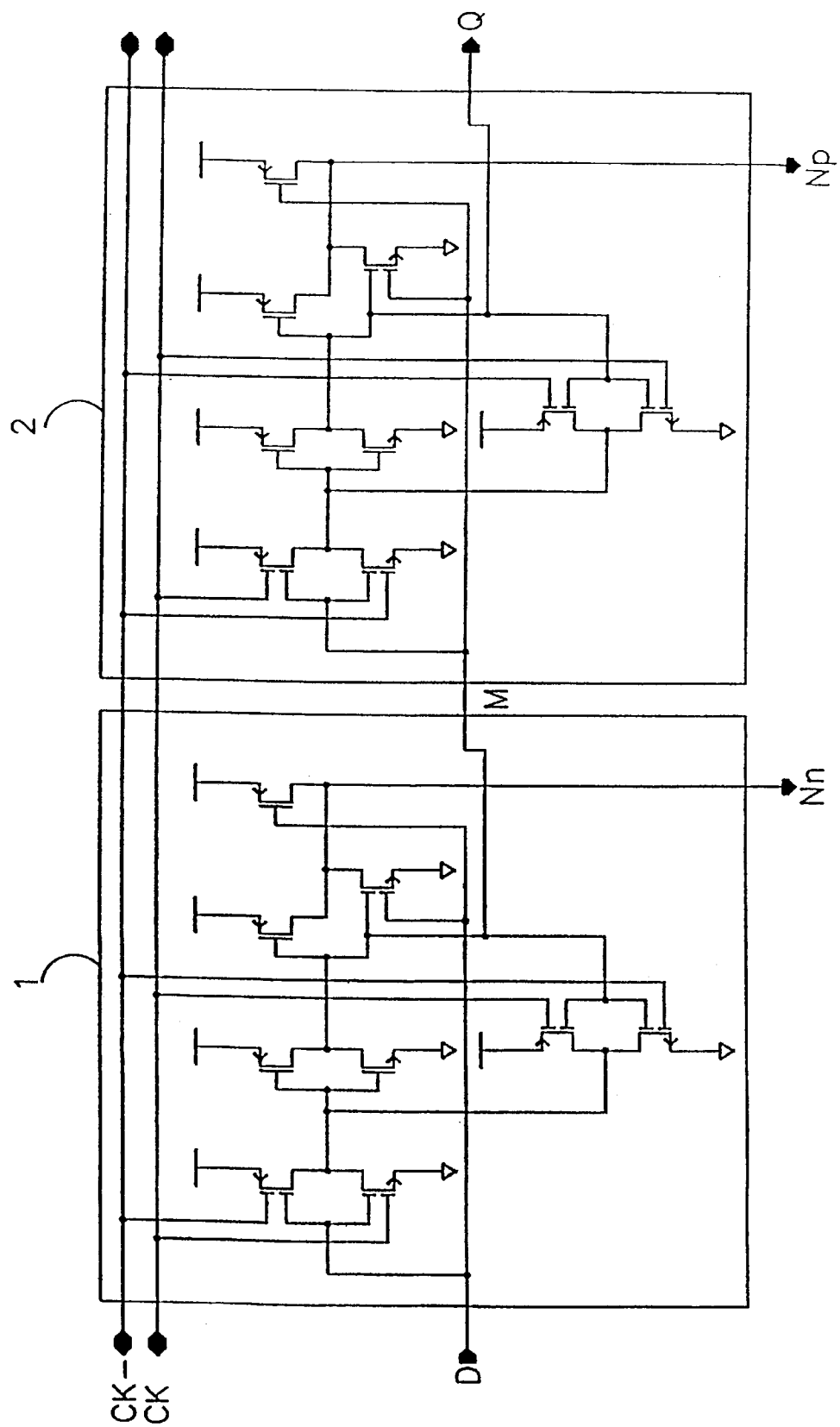
FIG. 1 is a circuit diagram of two stages of a known type of shift register.
Figure 2:
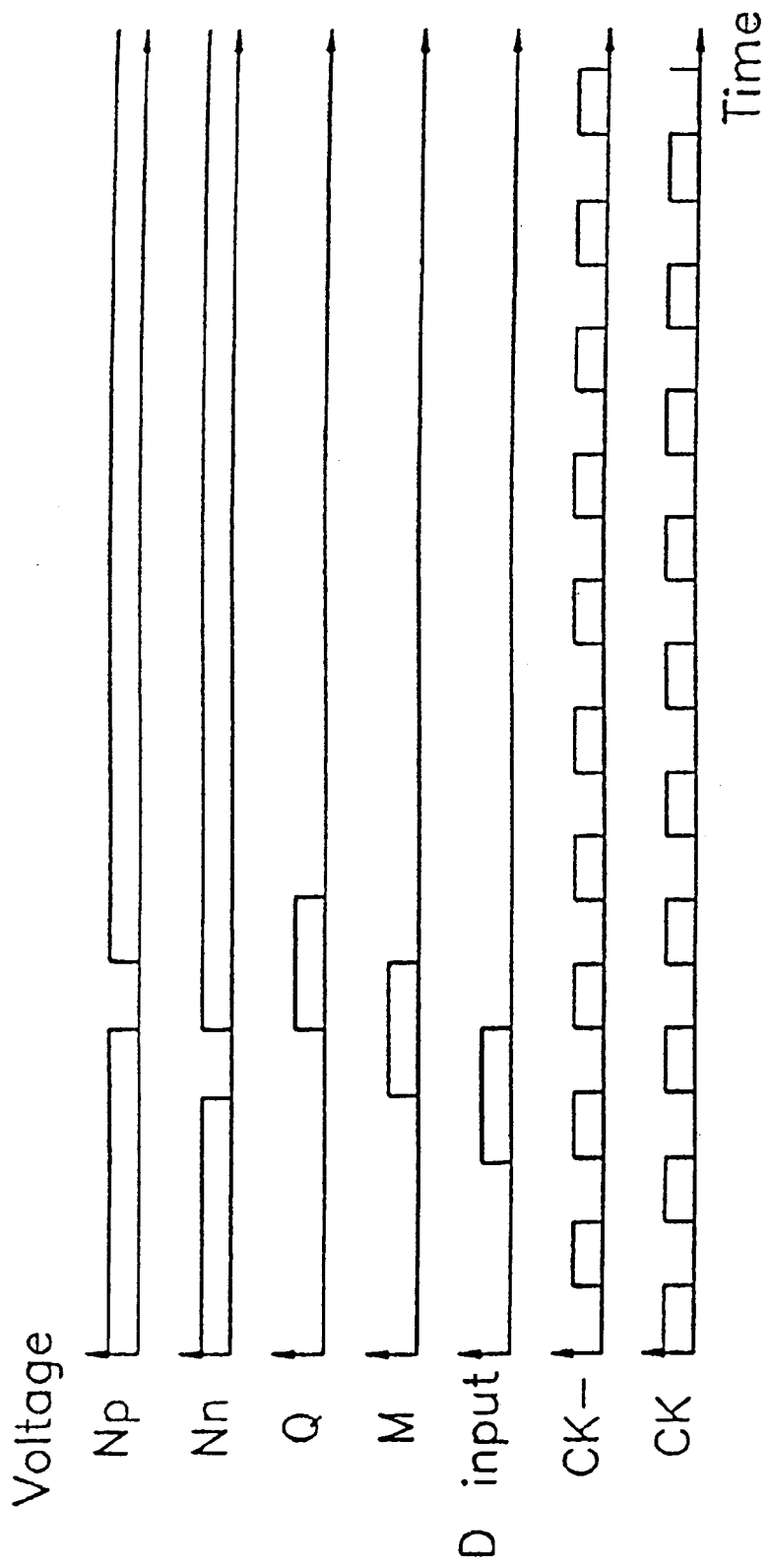
FIG. 2 is a diagram illustrating waveforms occurring in the stages shown in FIG. 1.
Figure 3:
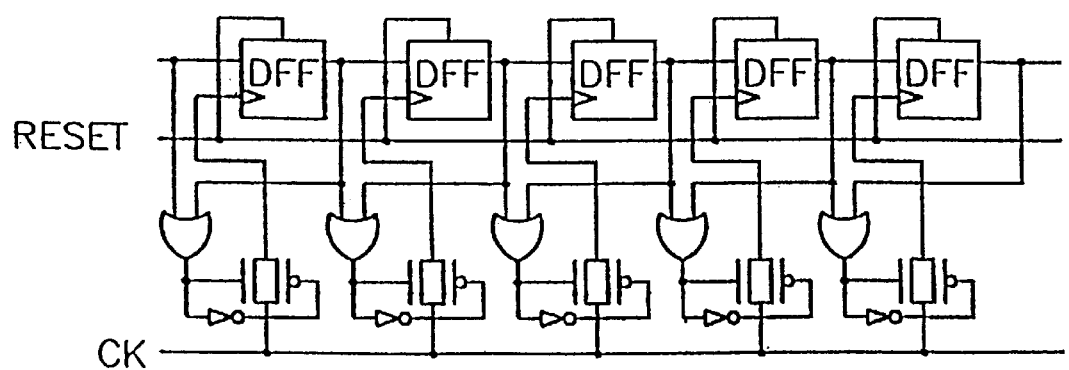
FIG. 3 is a block circuit diagram of a known type of clock pulse generator.
Figure 4:
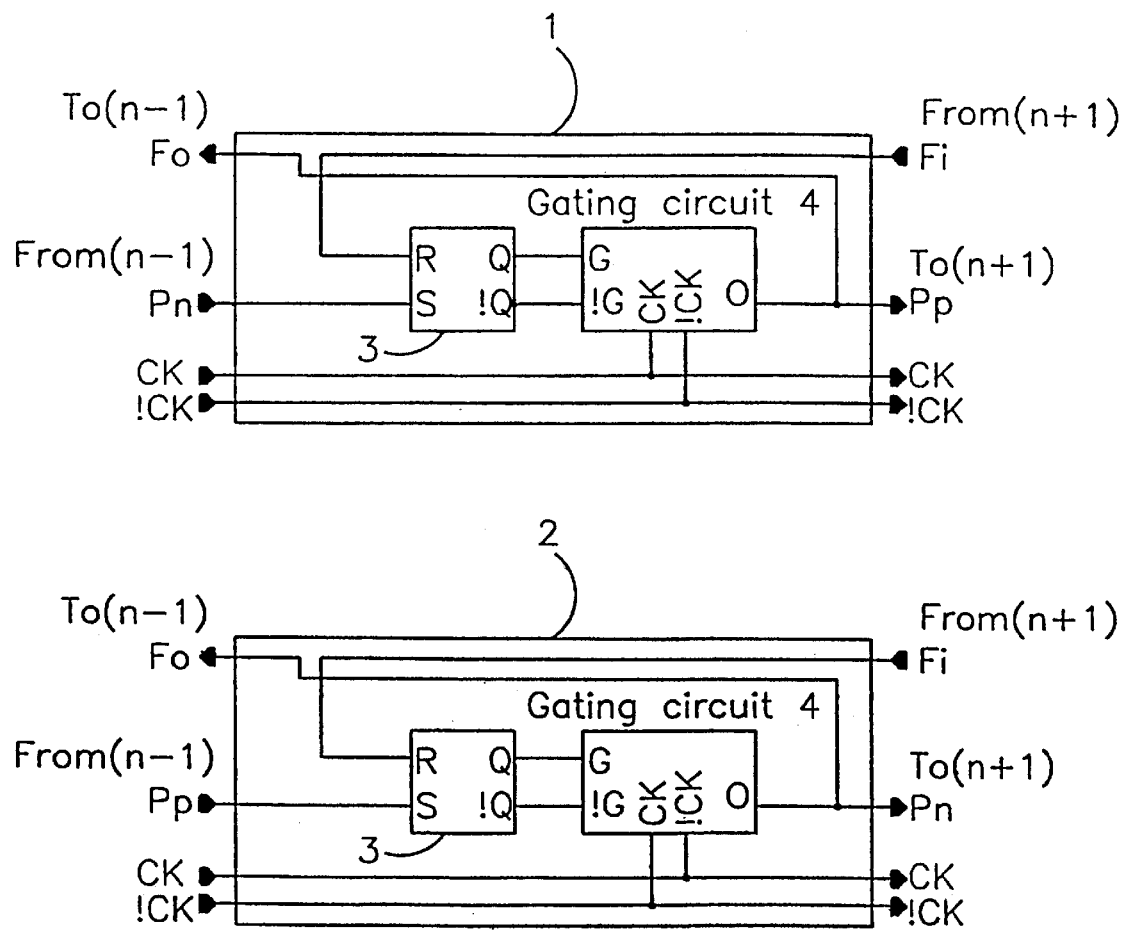
FIG. 4 is a circuit diagram of two stages of a static clock pulse generator constituting an embodiment of the invention.

In the following description, four types of pulses (each of half the clock pulse period) are identified as follows:

Pp: positive pulses: coinciding with positive-going pulses of clock signal CK;

Pn: positive pulses: coinciding with negative-going pulses of clock signal CK;

Np: negative pulses: coinciding with positive-going pulses of clock signal CK;

Nn: negative pulses coinciding with negative-going pulses of clock signal CK;

FIG. 4 shows two stages 1 and 2 of a static clock pulse generator. The stage 1 comprises a reset-set (RS) flip-flop 3 having a reset input R, a set input S, a direct output Q and a complementary or inverted output !Q. The set input S is connected to an input of the stage for receiving a set signal Pn from the preceding or (n−1)th stage, which signal is also the output signal of the preceding stage. The reset input R is connected to an input Fi for receiving a reset signal from the (n+1)th stage.

The outputs Q and !Q of the flip-flop 3 are connected to gate inputs G and !G, respectively, of a gating circuit 4, which has complementary clock inputs CK and !CK, which are connected to the complementary phases of a two phase clock input CK and !CK, respectively. However, depending on the actual arrangement of the gating circuit 4, only one of the flip-flop outputs may be used for a gating circuit 4 having a single gate input. Similarly, the gating circuit 4 may have a single clock input connected to one of the clock phases or to a single clock phase. The output O of the gating circuit 4 is connected to the output Pp of the stage 1 for supplying a set signal to the following or (n+1 )th stage. Also, the output O of the gating circuit 4 is connected to an output Fo for supplying a reset signal to the preceding or (n−1)th stage.

The stage 2 shown in the lower part of FIG. 4 differs from the stage 1 in that the stage 2 receives a set signal Pp from the (n−1)th stage and supplies a set signal Pn to the (n+1)th stage. Also, the gating circuit 4 of the stage 1 is arranged to supply positive pulses Pp coinciding with the positive-going pulses of the clock signal CK whereas the stage 2 is arranged to supply at its output positive pulses Pn coinciding with negative-going pulses of the clock signal CK (which coincide with positive-going pulses of the complementary clock signal ICK).

The gating circuit 4 is controlled by either or both outputs Q and IQ of the flip-flop 3 in each stage so as to transmit a single clock pulse from one of the clock inputs CK and !CK. When the gating input signals to the circuit 4 are inactive, i.e. when the flip-flop 3 is reset, the output O of the circuit 4 and hence of the stage 1 or 2 is held low.

Figure 5:
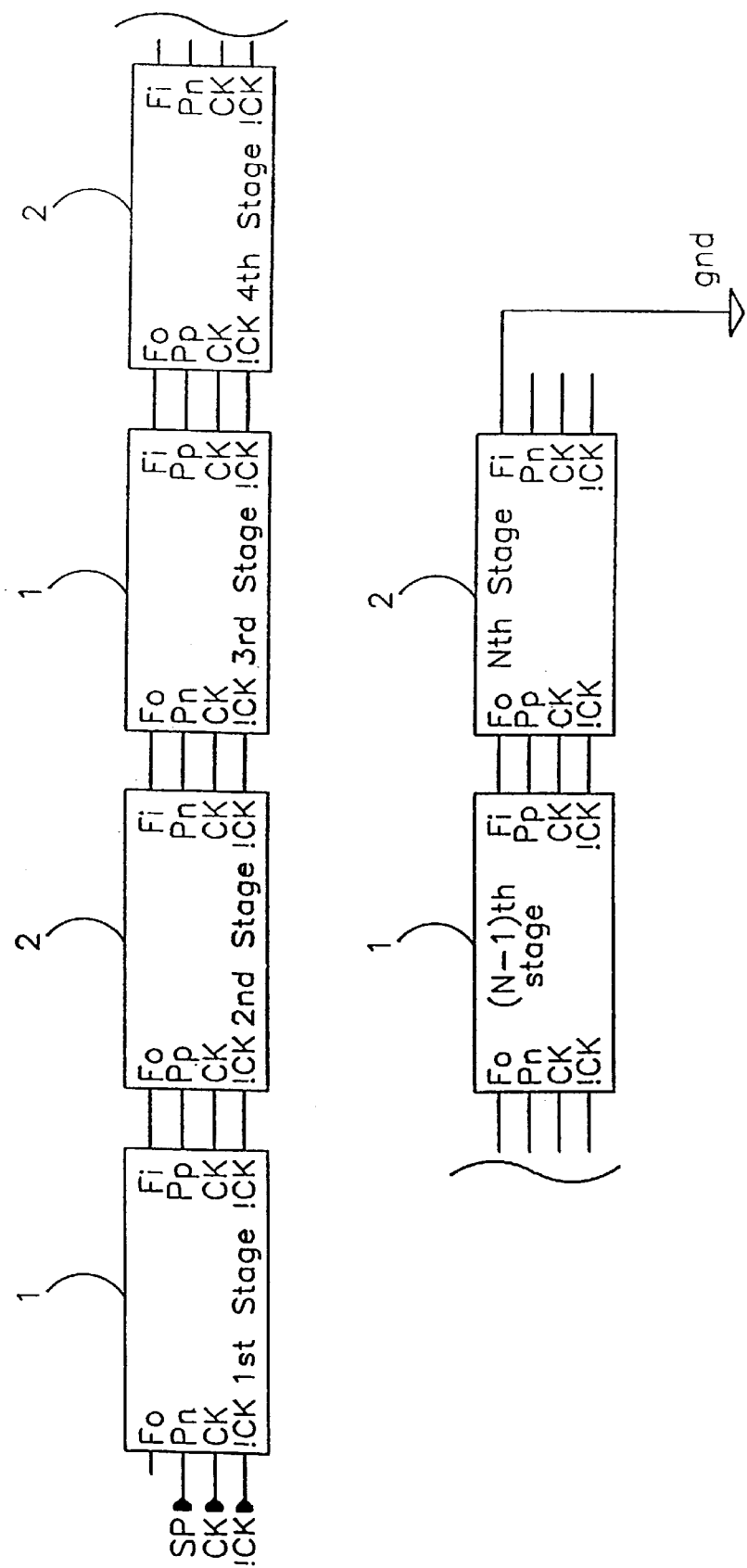
FIG. 5 is a block diagram of the clock pulse generator whose stages are shown in FIG. 4.

FIG. 5 shows part of a static clock pulse generator which comprises N stages 1, 2 connected in cascade. The stages 1 alternate with the stages 2. The set signal input Pn of the first stage is arranged to receive a start pulse SP whereas the clock inputs are connected to receive complementary clock signals CK and !CK from the two phase clock input. The input Fi of each stage 1, 2 is connected to the output Fo of the following stage. The input Fi of the last or Nth stage is connected to ground gnd.

Figure 6:
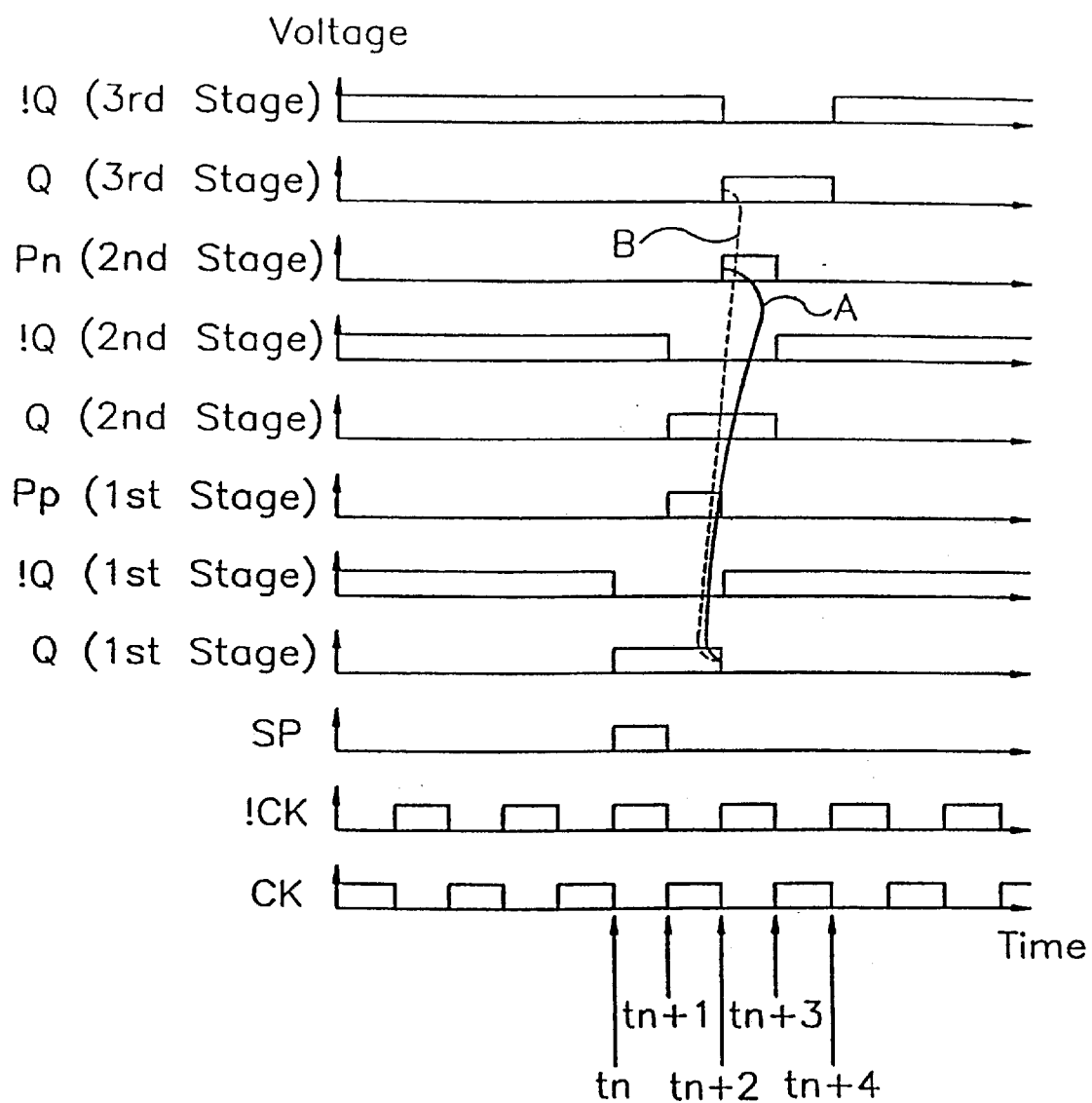
FIG. 6 is a timing diagram illustrating waveforms occurring in the clock pulse generator shown in FIGS. 4 and 5.

Operation of the static clock pulse generator is illustrated by the timing diagram of FIG. 6 which illustrates various waveforms occurring in the first three stages of the generator of FIG. 5. Initially, the flip-flops 3 of all of the stages 1, 2 are in a reset state so that the direct outputs Q are low, the complementary outputs !Q are high and the outputs Pn and Pp are all low.

At time tn, a start pulse SP is supplied to the input Pn of the first stage 1. The flip-flop 3 of this stage is set so that the output 0 goes high and the complementary output !Q goes low. The gating circuit 4 is thus switched on and the output signal Pp of the first stage follows the clock signal CK.

At time tn+1, the clock signal CK goes high so that the output signal Pp of the first stage 1 goes high. The flip-flop 3 of the second stage 2 is set so that its outputs Q and !Q go high and low, respectively. The gating circuit 4 of the second stage 2 is switched on so that the output signal Pn of the second stage 2 follows the complementary clock signal !CK.

At time tn+2, the complementary clock signal !CK goes high and hence so does the output signal Pn of the second stage 2. The flip-flop of the third stage 1 is thus set and its output Q goes high. The signal Pn is fed back to the reset input R of the flip-flop 3 of the first stage 1, which is therefore reset (as illustrated at A in FIG. 6). The gating circuit 4 of the first stage 1 is switched off so that the output Pp of the first stage 1 remains hold at ground potential until another start pulse is received.

Figure 7:
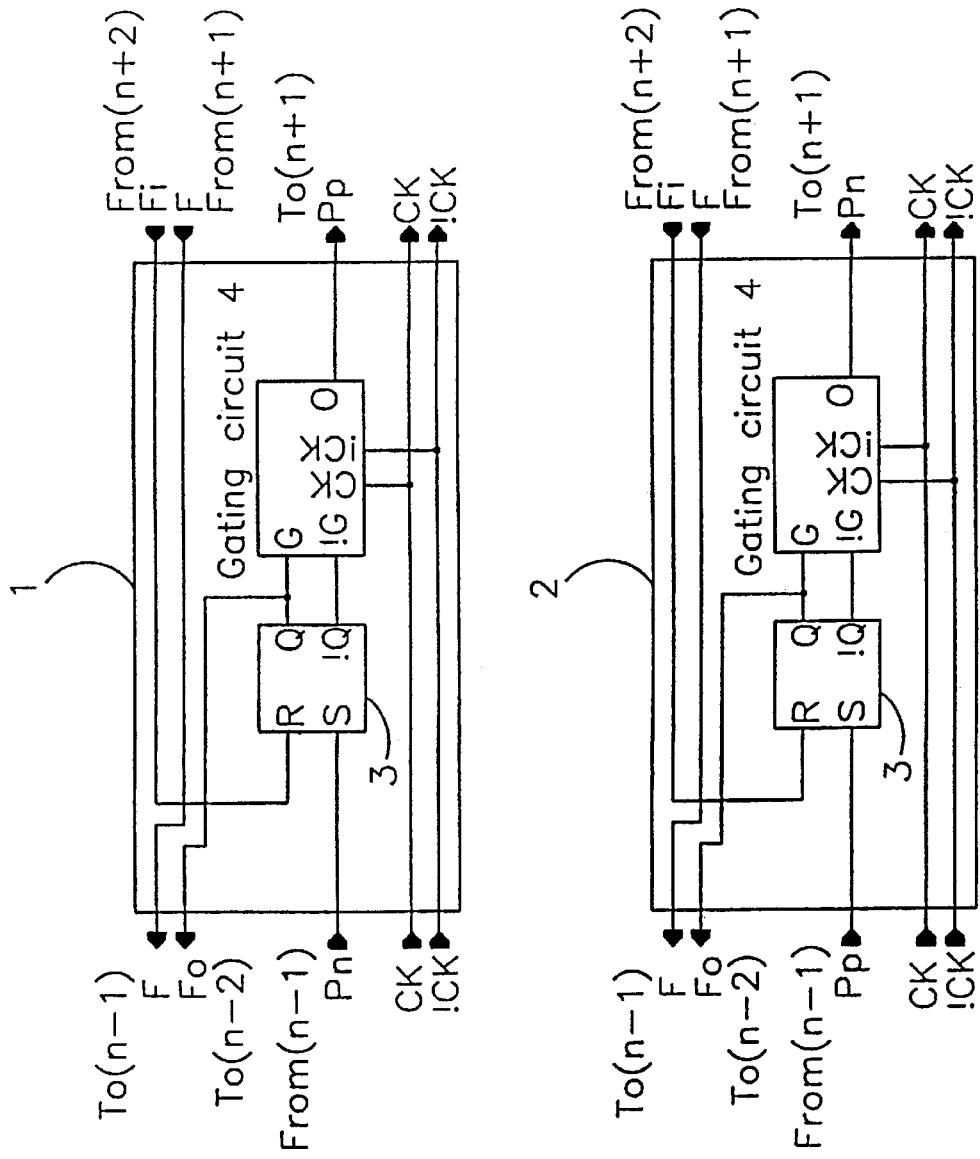
FIG. 7 is a circuit diagram of two stages of a static clock pulse generator constituting an embodiment of the invention.

The stages 1 and 2 shown In FIG. 7 differ from those shown In FIG. 4 in the feedback arrangements of resetting pulses. Each stage 1, 2 has an input F for receiving a reset signal from the (n+1)th stage and for routing this to an output F in order to supply the.reset signal to the (n−1)th stage. In each stage 1, 2, the reset signal as supplied by the Q output of the flip-flop 3 via the output Fo to the (n−1)th stage. Similarly, the reset input R of the flip-flop 3 connected to the input Fi receives a reset signal from the (n+2)th stage.

Because the flip-flop outputs respond to the pulses generated by the gating circuits 4, the delay between each gated pulse and the response of the flip-flop is small. The timing of signals occurring in the clock pulse generator shown in FIG. 8 and comprising the stages 1 and 2 shown in FIG. 7 are therefore similar to those occurring in the clock pulse generator shown in FIG. 5 so that the waveforms are almost identical to those illustrated in FIG. 6. However, as illustrated by the broken line B in FIG. 6, the rising edge of the flip-flop output Q of the third stage resets the signal Q of the first stage so that these signals are guaranteed to be overlapping. This may be an important feature if further logic signals of a certain type are required to be generated from the outputs Q of the flip-flops 3 by combinational logic.

Figure 9:
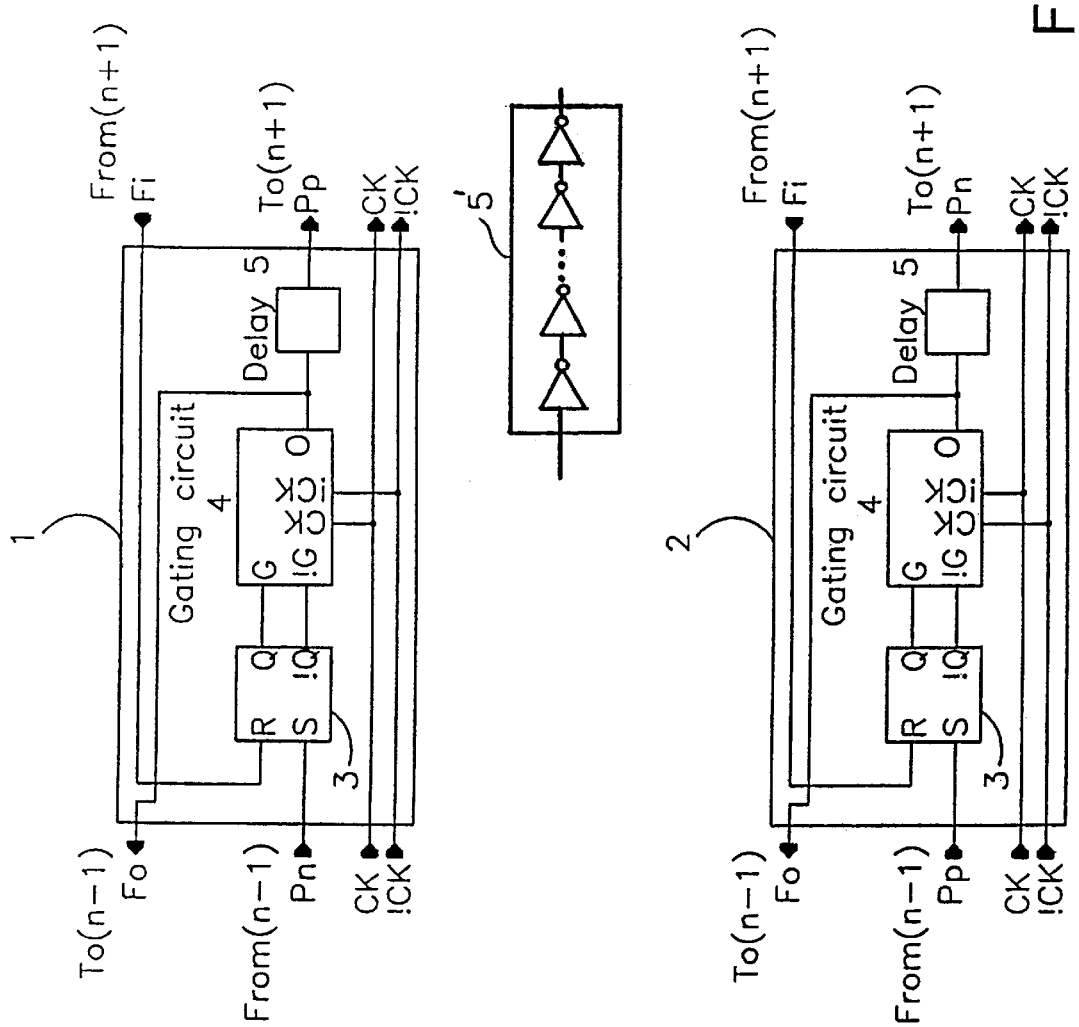
FIG. 9 is a circuit diagram of two stages of a static clock pulse generator constituting an embodiment of the invention
Figure 10:
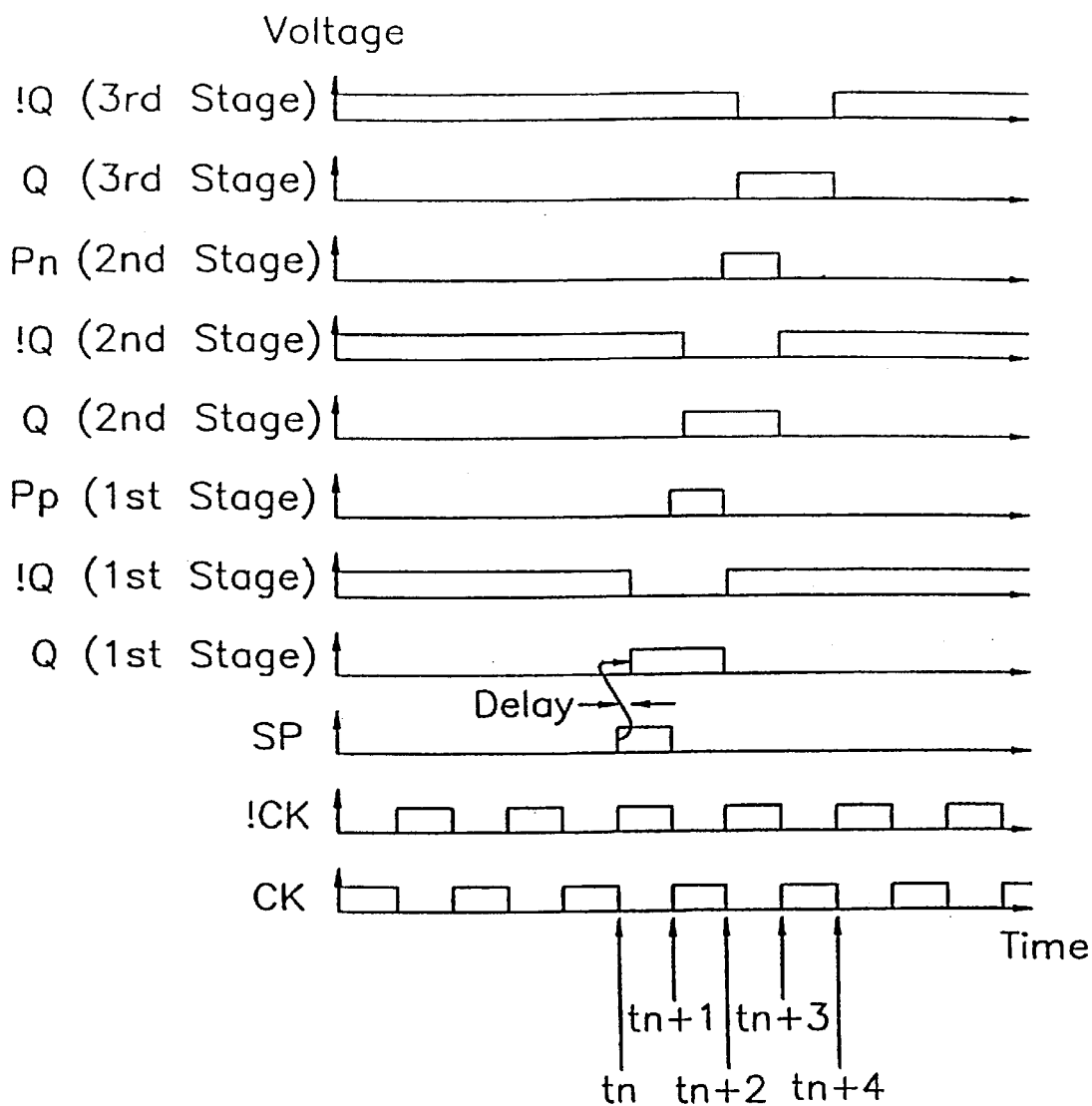
FIG. 10 is a timing diagram illustrating waveforms occurring in a clock pulse generator whose stages are shown in FIG. 9.

Conversely, some applications require that the outputs Q of every other stage should be non-overlapping, in which case the stages 1 and 2 shown in FIG. 9 may be used. The stages 1 and 2 shown in FIG. 9 differ from those shown in FIG. 4 in that the output of each stage is connected to the output O of the gating circuit 4 via a delay circuit 5, which may be embodied as an even number of series connected or cascaded inverters as shown at 5'. However, the feedback reset signal to the preceding stage is supplied directly from the output O of the gating circuit 4 via the output Fo and so is not delayed. This ensures that the flip-flop of the preceding stage is reset before the flip-flop of the succeeding stage is set. FIG. 10 illustrates the effect of this on the outputs Q and !Q of the flip-flops of consecutive stages. This may be used by suitable combinational logic to derive further logic signals.

Figure 11:
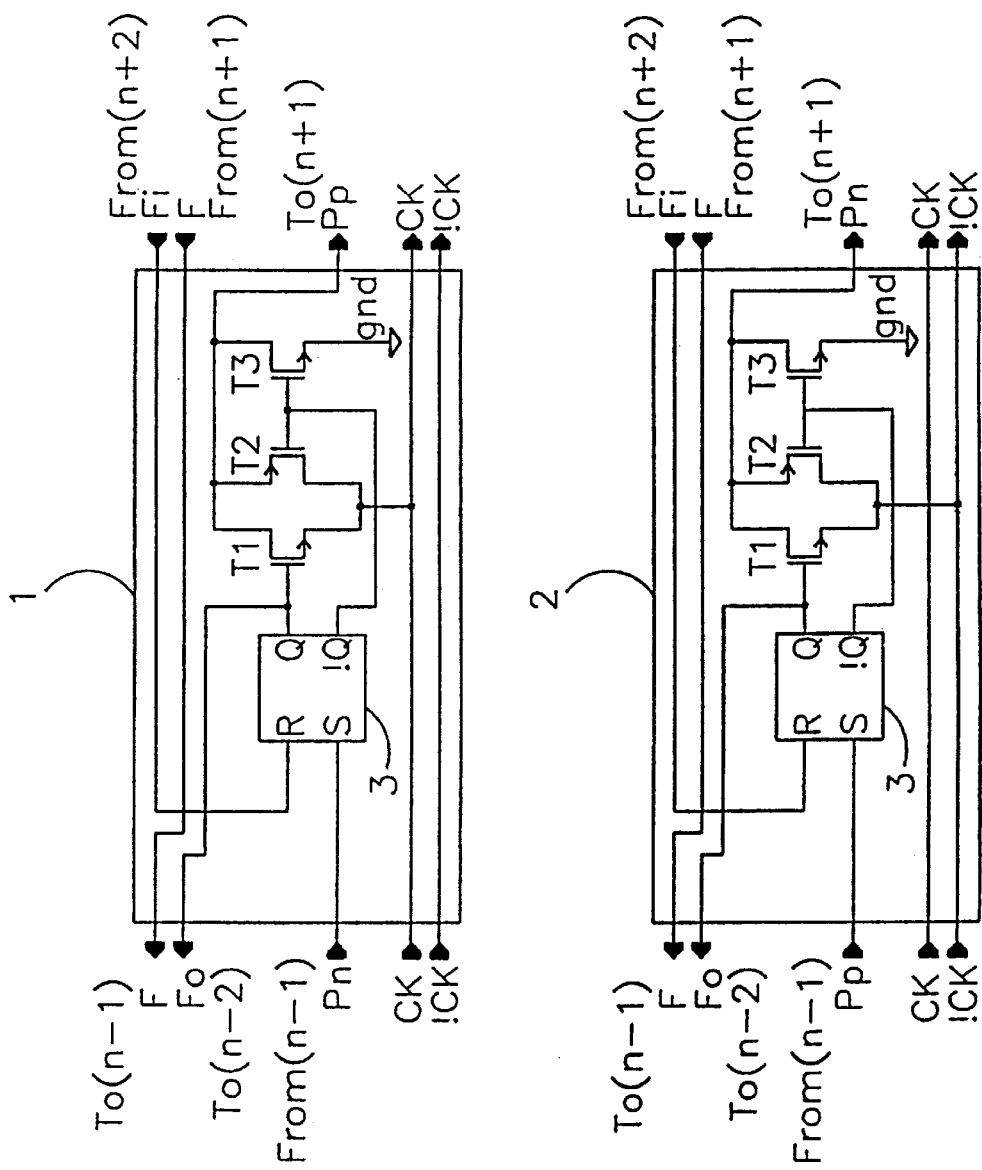
FIG. 11 is a circuit diagram of two stages of a static clock pulse generator constituting an embodiment of the invention.

FIG. 11 shows stages 1 and 2 of the type shown in FIG. 7 in which the gating circuits 4 are embodied in the form of transmission gates. In particular, the outputs Q and !Q of each flip-flop 3 are connected to the gates of transistors T1 and T2, respectively, whose source-drain paths are connected in antiparallal to form a transmission gate. The input of the transmission gate T1, T2 is connected to the phase CK or the phase !CK of the two phase clock input in the stage 1 or the stage 2, respectively. The output of the transmission gate T1, T2 is connected to the output Pp or Pn of the stage 1 or 2, respectively. A pull-down transistor T3 has a source connected to a ground or power supply input gnd, a drain connected to the output Pp of the stage 1 or Pn of the stage 2, and a gate connected to the complementary output !Q of the flip-flop 3.

When the flip-flop 3 is in its reset state, the transmission gate T1, T2 is switched off and the transistor T3 holds the output of the stage at ground potential. When the flip-flop 3 is in its set state, the transmission gate T1, T2 is switched on to connect the stage output to the appropriate clock phase and the pull-down transistor T3 is disabled.

Figure 12:
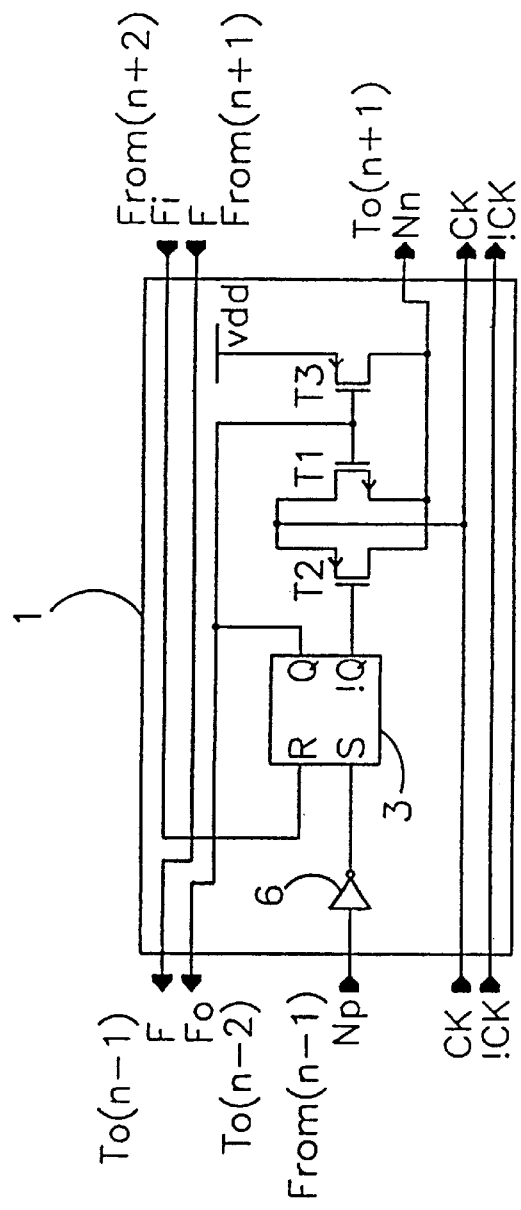
FIG. 12 is a circuit diagram of two stages of a static clock pulse generator constituting an embodiment of the invention.
Figure 12:
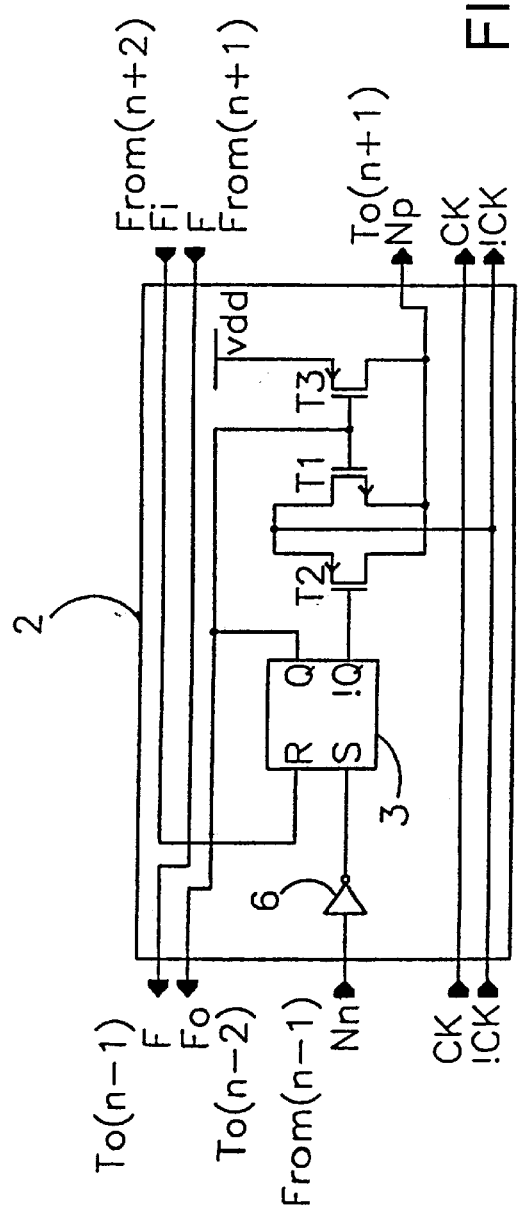

The stages 1 and 2 shown in FIGS. 4, 7, 9 and 11 supply positive pulses at the outputs Pp and Pn synchronised with the rising edges of the clock pulses CK and !CK. However, It is also possible to provide a static clock pulse generator which supplies negative output pulses Nn and Np. FIG. 12 Illustrates stages 1 and 2 which provide such pulses and which may be connected together as shown in FIG. 8 to form a static clock pulse generator.

The stage 1 shown In FIG. 12 differs from that shown in FIG. 11 in that an inverter 6 is connected between the input, Np and the set input S of the flip-flop 3 and the output Nn is provided with a pull-up transistor T3 whose source is connected to a power supply input vdd and whose gate is connected to the direct output Q of the flip-flop 3. Similarly, the stage 2 shown in FIG. 12 differs from that shown in FIG. 11 in that an inverter 6 is connected between the input Nn and the set input S of the flip-flop 3 and the output Np is provided with a pull-up transistor T3 whose gate is connected to the direct output Q of the flip-flop 3.

Figure 8:
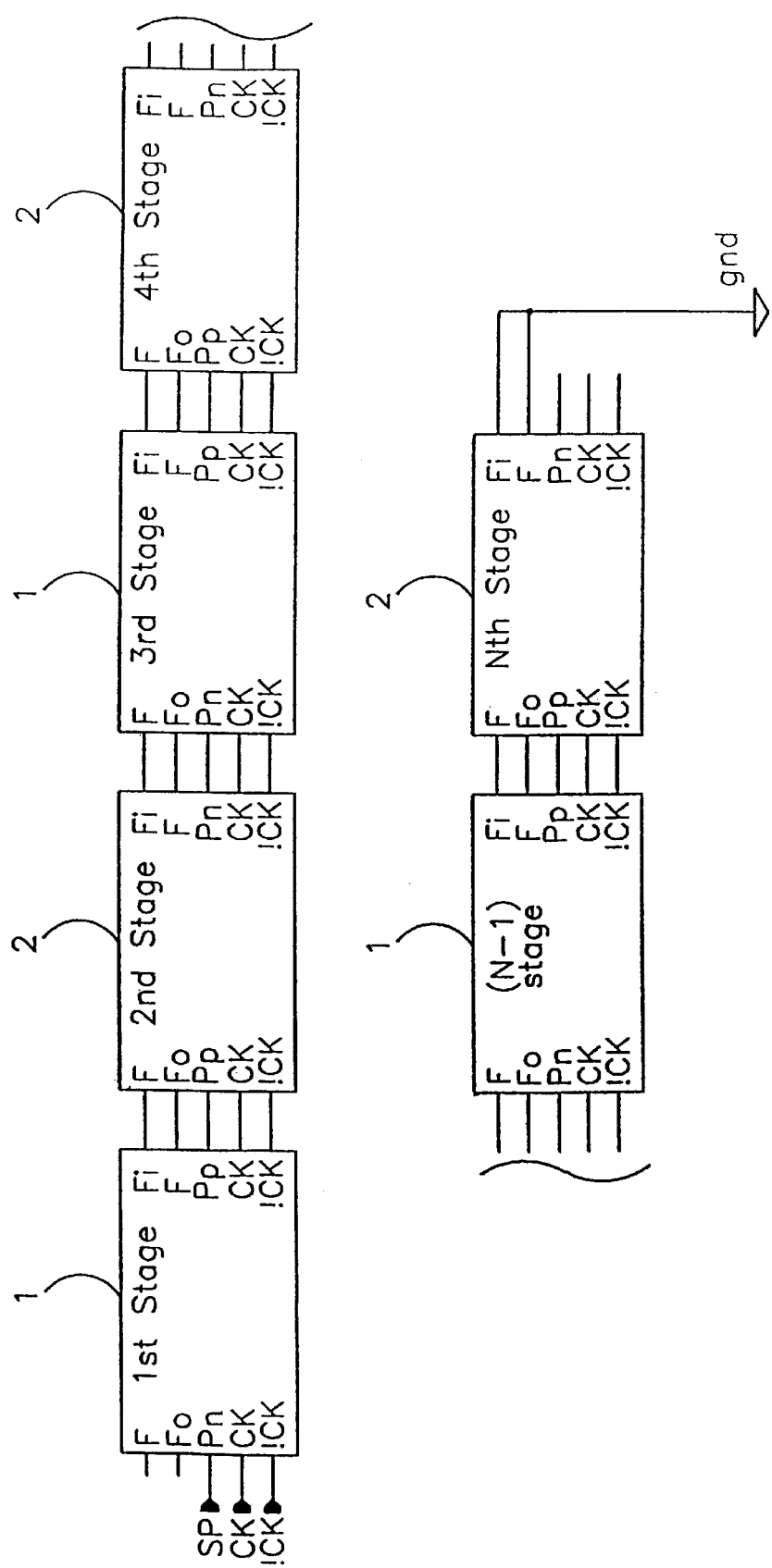
FIG. 8 is a block diagram of a clock pulse generator whose stages are illustrated in FIG. 7.
Figure 13:
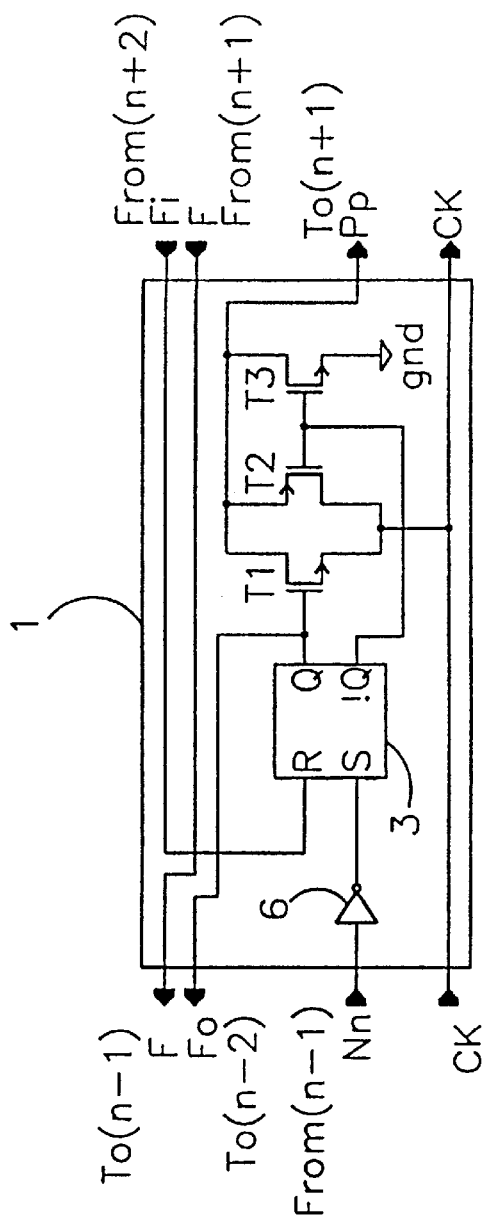
FIG. 13 is a circuit diagram of two stages of a static clock pulse generator constituting an embodiment of the invention.
Figure 13:
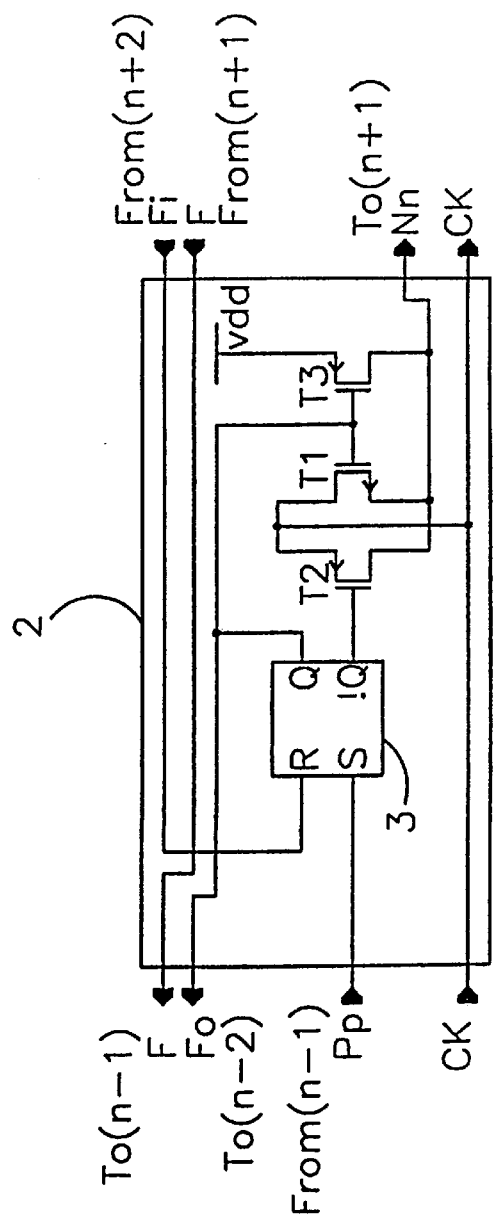

FIG. 13 illustrates stages 1 and 2 which may be connected together as shown in FIG. 8. The stage 1 supplies positive going output signals Pp whereas the stage 2 supplies negative going output signals Nn. The stage 1 differs from that shown in FIG. 11 in that an inverter 6 is provided between the input Nn and the set input S of the flip-flop 3. The stage 2 differs from that shown in FIG. 12 in that the inverter 6 is omitted and the input of the transmission gate T1, T2 is connected to the single phase clock input CK. Thus, the whole static clock pulse generator requires a single phase clock input CK and alternate stages provide opposite polarity output signals or pulses.

Figure 14:
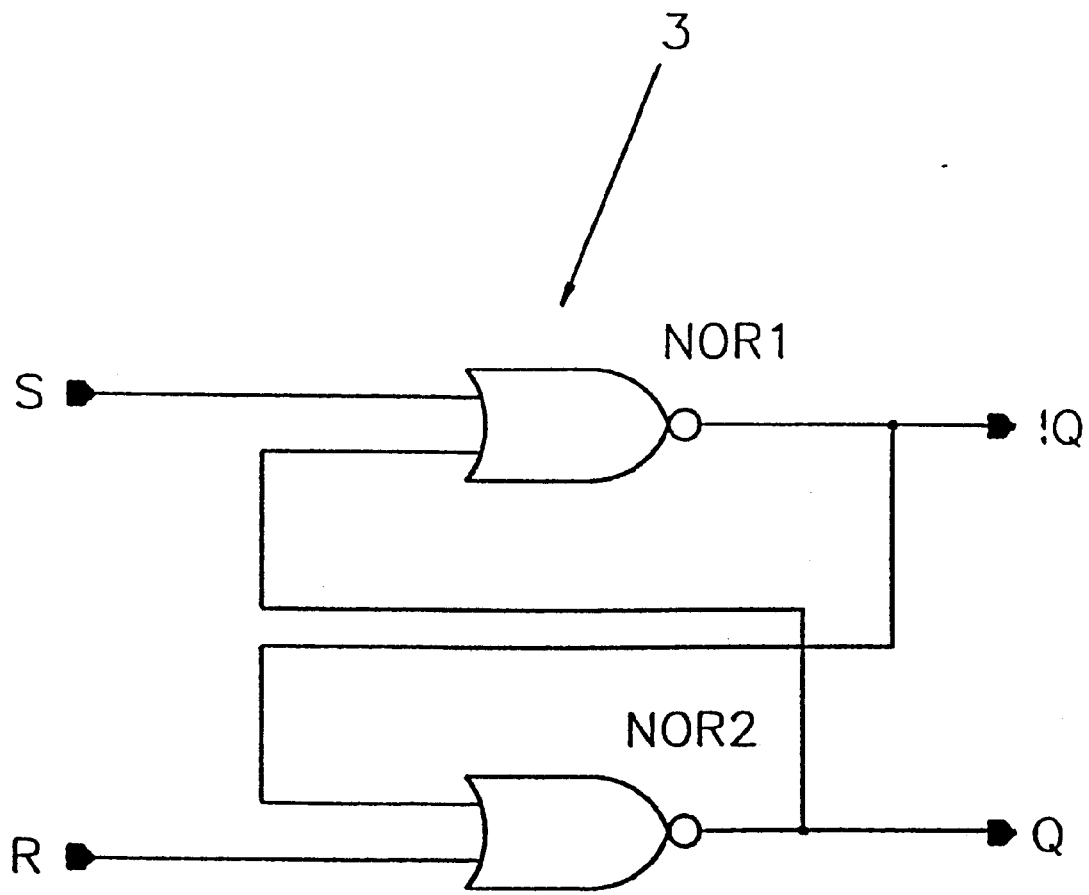
FIG. 14 is a schematic diagram of a reset-set flip-flop which may be used in the stages illustrated in FIGS. 4, 7, 9 and 11 to 13.
Figure 15:
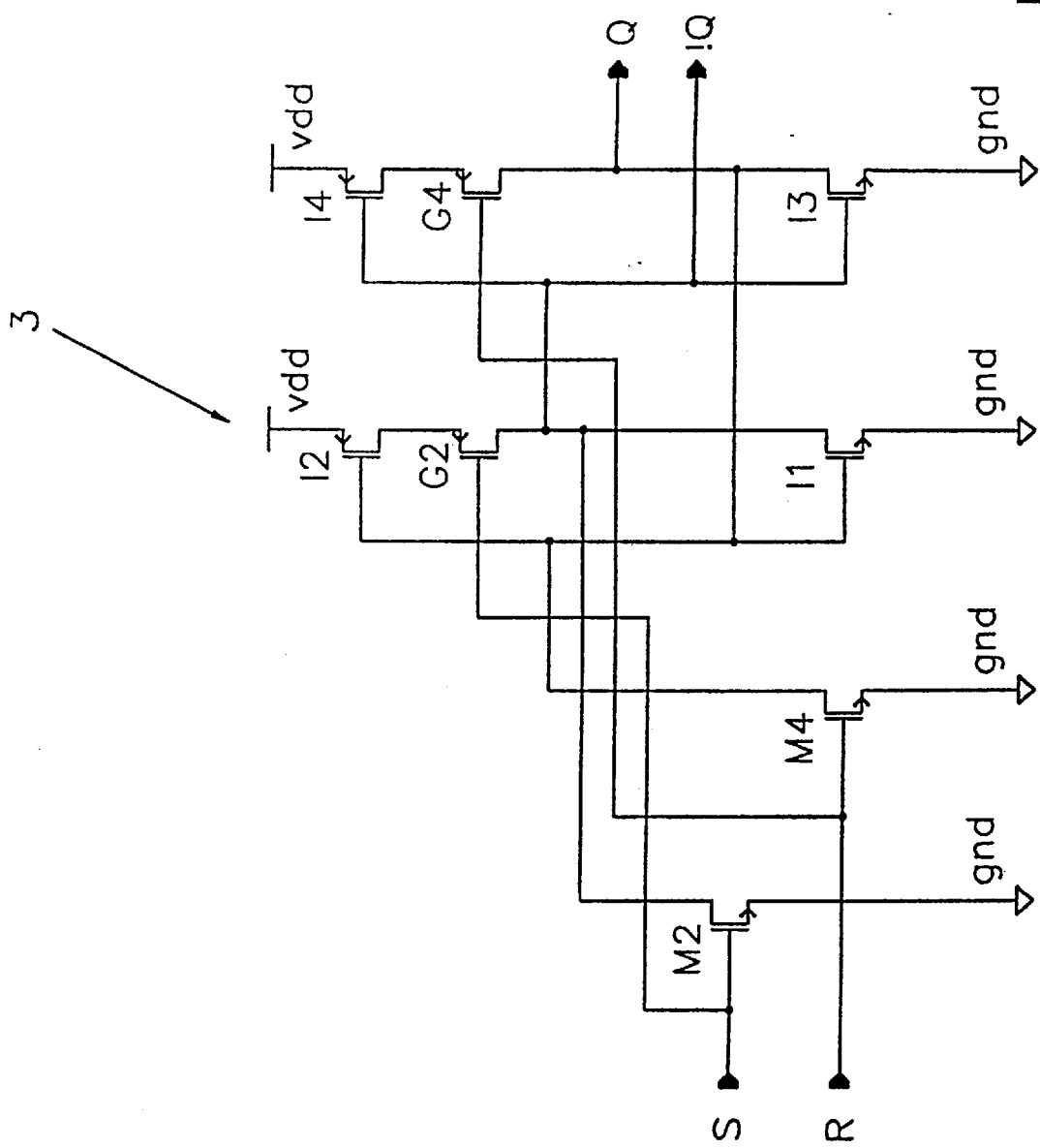
FIG. 15 is a circuit diagram of the flip-flop shown in FIG. 14.

The flip-flops 3 may be embodied in any suitable way. For example, a known type of RS flip-flop comprises a pair of cross-coupled NOR gates as shown in FIG. 14 and as disclosed in F. Hill and G. Peterson, "Digital Logic and Microprocessors", John Wiley and Sons, 1984. The flip-flop comprises a pair of two input gates NOR1 and NOR2. One of the inputs of the gate NOR1 comprises a set input S whereas one of the inputs of the gate NOR2 comprises a reset input R. The output of the gate NOR1 comprises a complementary output !Q of the flip-flop and is connected to the second input of the gate NOR2. The output of the gate NOR2 comprises an output Q of the flip-flop and is connected to the second input of the gate NOR1. The output Q and the complementary output !Q respond to set and reset signals in accordance with the following truth table:

| S | R | $Q_t$ | $!Q_t$ |
|---|---|---|---|
| 0 | 0 | $Q_{t-1}$ | $!Q_{t-1}$ |
| 0 | 1 | 0 | 1 |
| 1 | 0 | 1 | 0 |
| 1 | 1 | Undefined | | where 0 and 1 represent logic low and logic high levels, $Q_t$ and $!Q_t$ represent the current states of the outputs and $Q_{t-1}$ and $!Q_{t-1}$ represent the preceding states of the outputs. Thus, when the set and reset signals S and R are both 0, the outputs Q and !Q retain their prior states and are thus latched. When the set input S goes high, the flip-flop is set and the output Q goes high. When the reset input R goes high, the flip-flop is reset and the output Q goes low. The output states are undefined when the set and reset inputs are both high and a designer must ensure that this condition does not occur. The RS flip-flop shown in FIG. 14 may be embodied as an eight transistor CMOS integrated circuit of known type as shown in FIG. 15. The gate NOR1 comprises P-type transistors 12 and G2 and N-type transistors M2 and I1 whereas the gate NOR2 comprises P-type transistors I4 and G4 and N-type transistors M4 and I3.

Figure 16:
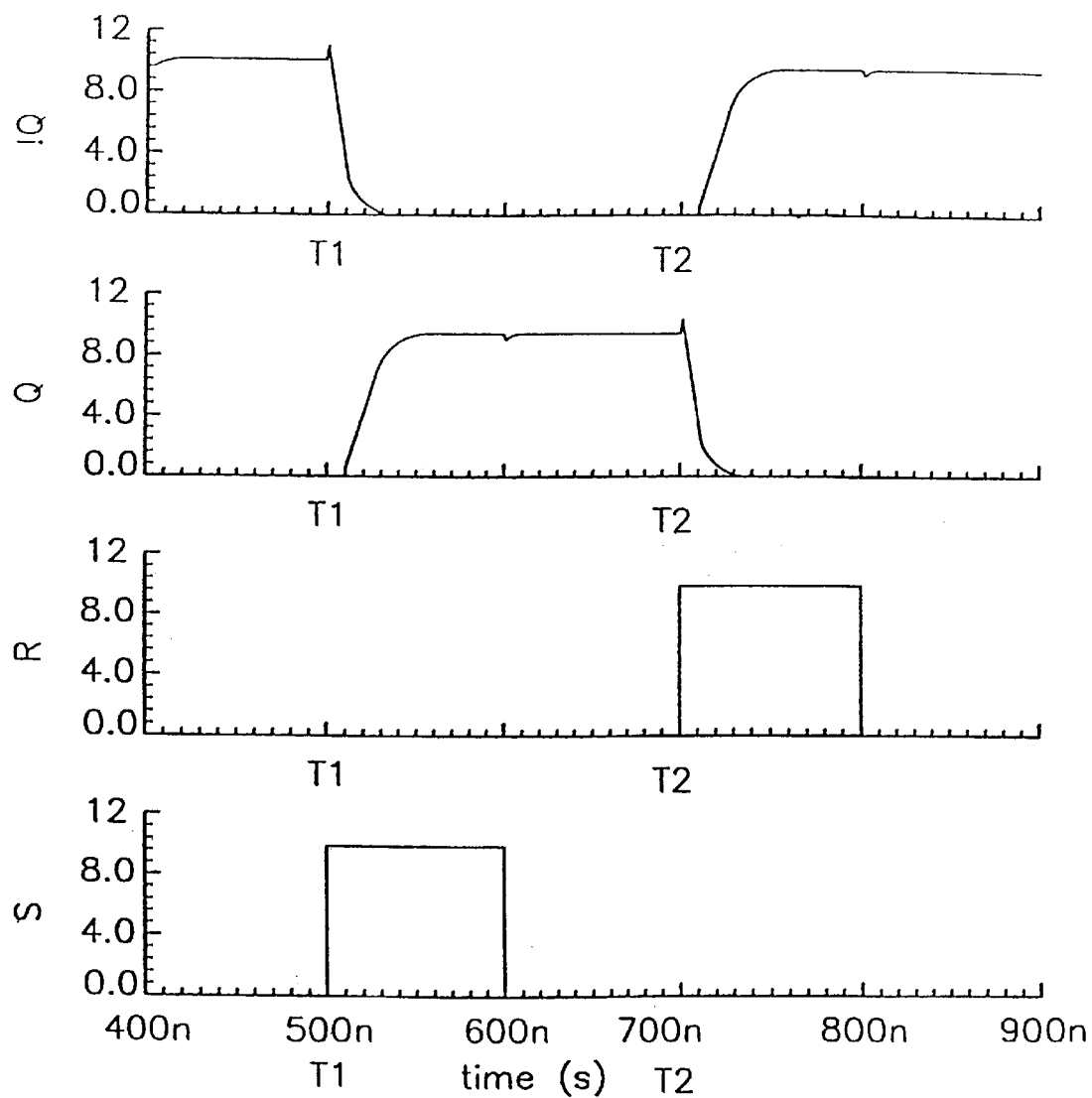
FIG. 16 is a timing diagram illustrating waveforms occurring in the flip-flop of FIG. 15.

FIG. 16 of the accompanying drawings is a graph showing four waveform diagrams against a common time axis of signals occurring at the inputs R and S and at the outputs Q and !Q.

The waveforms represent a simulation of the flip-flop illustrated in FIG. 15 using arbitrary voltage levels and poor transistor performance to emphasise the relative timing of signal edges. For the purposes of the simulation, all of the transistors are of equal size and the outputs Q and !Q are each loaded with a unit inverter.

Figure 17:
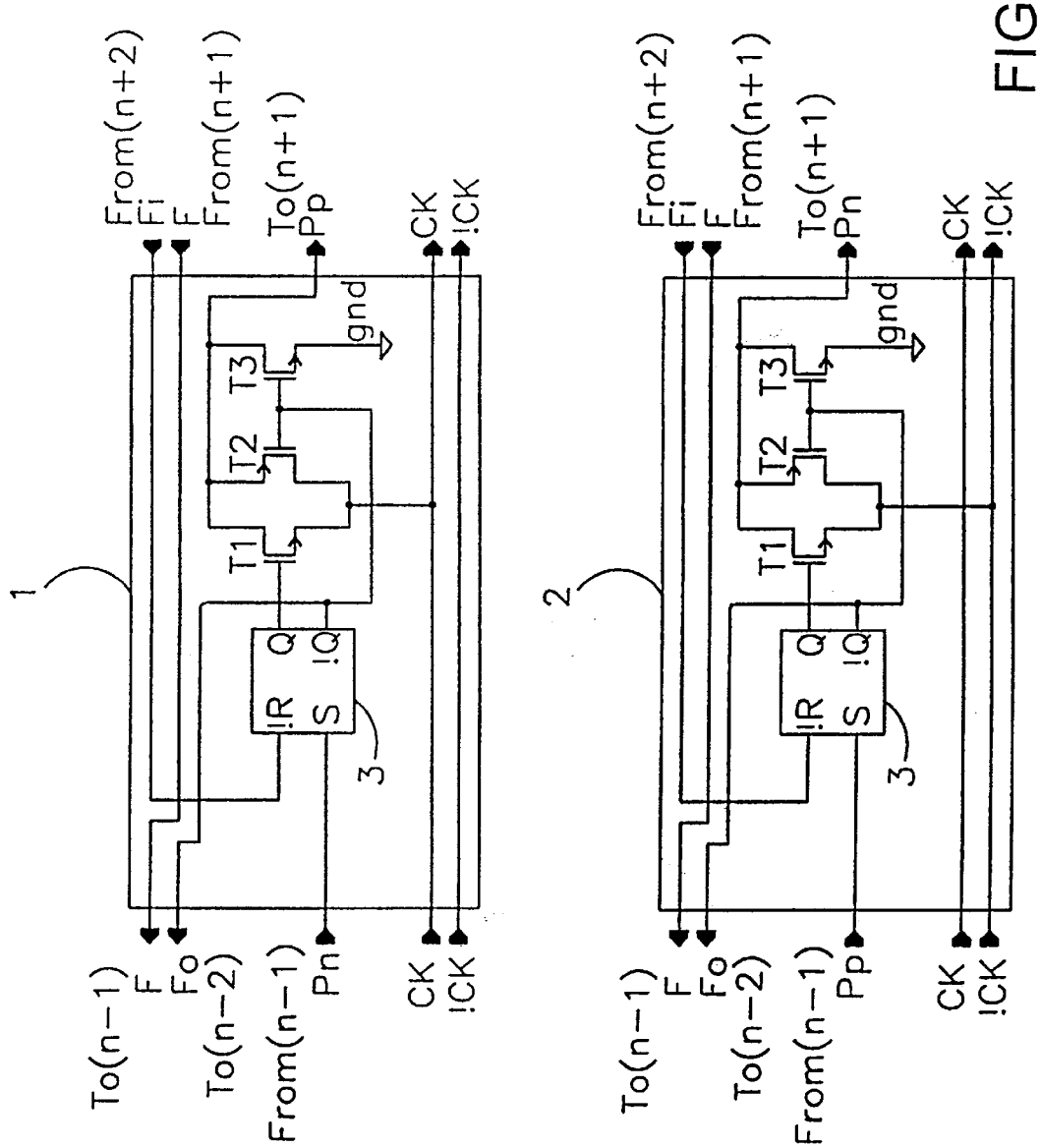
FIG. 17 is a circuit diagram of two stages of a static clock pulse generator constituting an embodiment of the invention.

The stages 1, 2 shown in FIG. 17 differ from those shown in FIG. 11 in that the flip-flop 3 has an active low reset input !R. Also, the reset signals fed back from each stage to the stage before the preceding stage are supplied by the complementary output !Q of the flip-flop 3.

Figure 18:
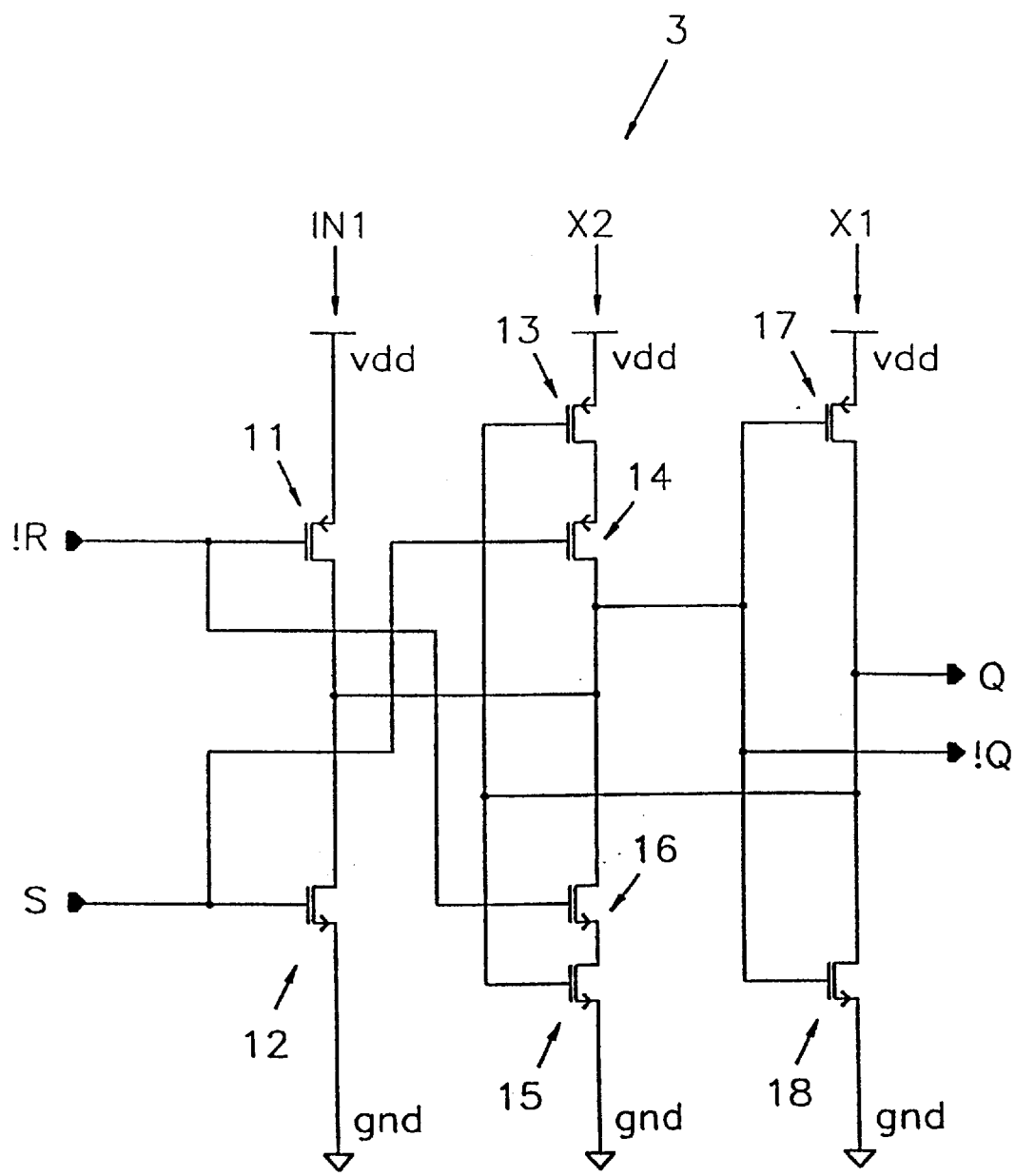
FIG. 18 is a circuit diagram of a reset-set flip-flop which may be used In the stages shown in FIG. 17.

The stages 1, 2 as shown in FIG. 17 allow the flip-flops 3 to be embodied by an improved type of flip-flop as shown in FIG. 18. The flip-flop 3 comprises an input circuit IN1 comprising a first P-type transistor 11 and an N-type transistor 12 connected in series between a first power supply input or line vdd and a ground or second power supply input or line gnd. The first transistor 11 has a gate which is connected to an active low reset input !R. The reset signal supplied to the input !R is therefore normally at logic high or 1, for example at the voltage of the supply line vdd, and switches to the logic low or 0, such as zero or ground voltage, when the flip-flop is to be reset. The gate of the second transistor 12 is likewise connected to a set input S which is active high i.e. normally at logic low but switching to logic high when the flip-flop is to be set.

The flip-flop further comprises a first inverter X1 and a second controllable inverter X2. The second inverter X2 comprises third and fourth P-type transistors 13 and 14 and fifth and sixth N-type transistors 15 and 16 connected in series between the supply lines vdd and gnd. The sources of the third and fifth transistors 13 and 15 are connected to the supply lines vdd and gnd, respectively whereas the gates are connected together to form the input of the inverter X2. The drains of the third and fifth transistors 13 and 15 are connected to the sources of the fourth and sixth transistors 14 and 16, respectively. The drains of the fourth and sixth translators 14 and 16 are connected together to form the output of the second inverter X2. The gate of the fourth transistor 14 is connected to the set input S whereas the gate of the sixth transistor 16 is connected to the reset input !R.

The first inverter X1 comprises a seventh P-type transistor 17 and an eighth N-type transistor 18 which are connected in series between the supply lines vdd and gnd. The gates of the transistors 17 and 18 are connected together to form the input of the first inverter X1 whereas the drain of the transistors 17 and 18 are connected together to form an output Q of the flip-flop. The input of the first inverter X1 is connected to the output of the second inverter X2 and to a complementary output !Q of the flip-flop. The output of the first inverter X1 is connected to the input of the second inverter X2. The input of the first inverter X1 is connected to the output of the input circuit IN1 formed by the drains of the transistors 11 and 12.

Because the flip-flop shown in FIG. 18 has an active high set input S and an active low reset input !R, its response to, logic level signals differs from the arrangement illustrated in FIGS. 14 and 15. The response to the various combinations of logic level input signals is as follows:

| S | !R | $Q_t$ | $!Q_t$ |
|---|---|---|---|
| 0 | 1 | $Q_{t-1}$ | $!Q_{t-1}$ |
| 0 | 0 | 0 | 1 |
| 1 | 1 | 1 | 0 |
| 1 | 0 | Undefined | | where the symbols are as described hereinbefore. When the set signal is inactive (logic 0) and the reset signal is inactive (logic 1), the translators 11 and 12 are switched off whereas the transistors 14 and 16 are conductive. The inverter X2 therefore functions as an inverter such that the signal at its output is the logical complement of the signal at its input. The flip-flop therefore comprises cross-coupled inverters with the outputs Q and !Q locked in opposite logic states which depend on whether the flip-flop was more recently set or reset.

If the flip-flop was more recently reset such that the output Q is at logic level 0 and the output !Q is at logic level 1, the flip-flop may be set by applying an active set signal (logic 1) to the set input S while the reset input !R remains at logic level 1 corresponding to the inactive reset signal. The second transistor 12 is thus turned on whereas the fourth transistor 14 is turned off so as to isolate the output of the second inverter X2 from the first supply line vdd. The input of the first inverter X1, which is connected to the output of the second inverter X2, is therefore pulled low by the transistor 12 so that the output Q is set to logic 1. This is fed back to the transistor 15, which ensures that the input of the inverter X1 is held at logic 0 after the set signal has ceased and the transistor 12 is switched off. The transistor 13 is similarly switched off by the feedback signal.

If the flip-flop was more recently set such that the output Q is at logic 1 and the output !Q is at logic 0 the flip-flop can be reset by an inactive set signal (logic 0) and an active reset signal (logic 0). In this case, the first transistor 11 is turned on by the active reset signal whereas the transistor 16 is turned off. A logic level 1 is supplied to the input of the inverter X1 which therefore supplies a logic 0 signal at the output Q. This is fed back to the input of the second inverter X2 so that the transistor 13 conducts and the transistor 15 is switched off. When the reset signal returns to its inactive (logic 1) level, the cross-coupled inverters X1 and X2 retain the reset state.

As described hereinbefore, the output states for both the set and the reset signals being active are not defined. If both signals were active, then both transistors 11 and 12 would conduct between the supply lines vdd and gnd and the output of the input circuit IN1 would be undefined. It is therefore essential for a designer to ensure that the input signals of the flip-flop cannot both be active at the same time.

Figure 19:
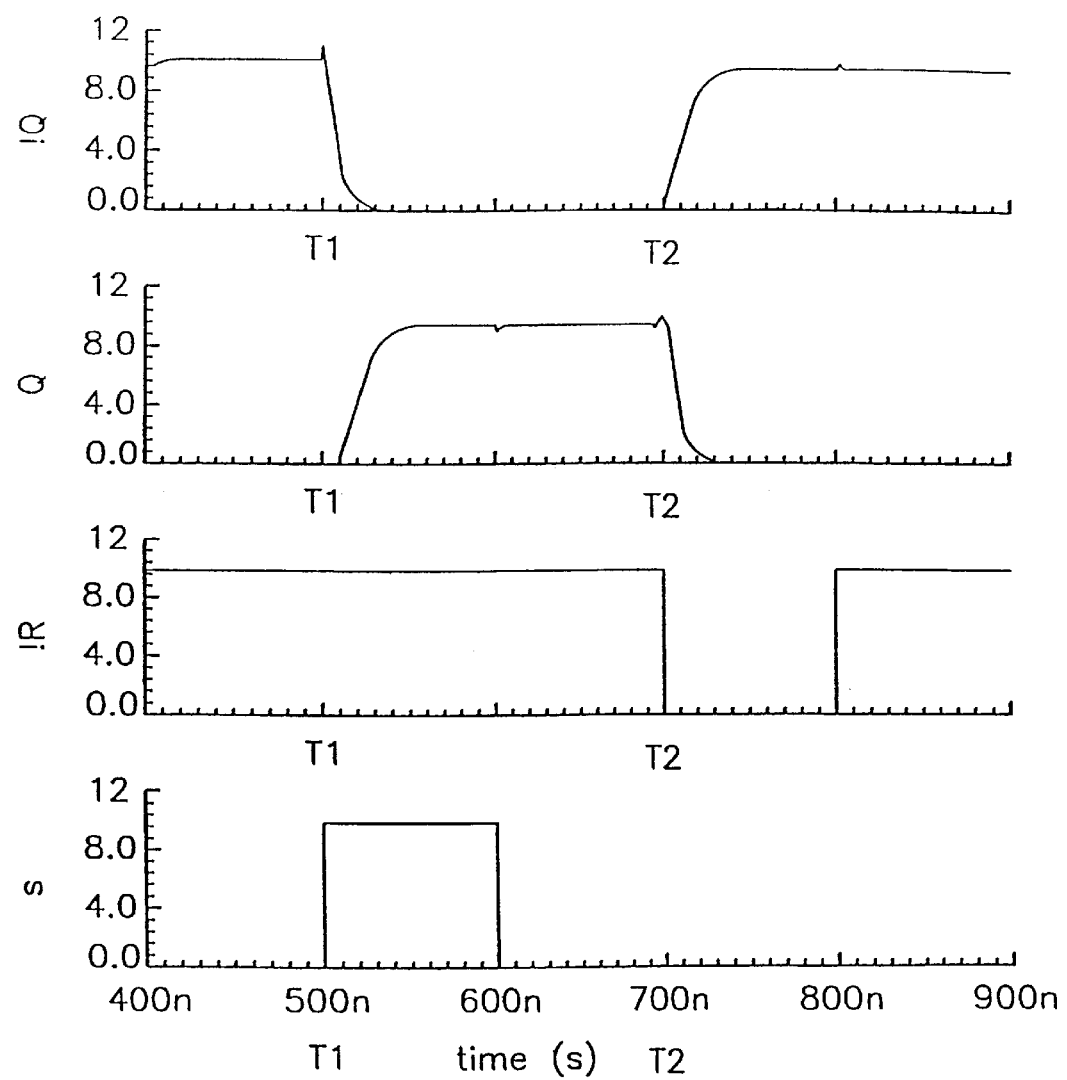
FIG. 19 is a timing diagram illustrating waveforms occurring in the flip-flop of FIG. 18.

FIG. 19 illustrates input and output waveforms of the circuit of FIG. 18 for set and reset operations. These waveforms were obtained by simulation using the same parameters as were used to obtain the waveforms shown in FIG. 16. At time T1, the flip-flop of FIG. 18 in set and the complementary output !Q responds before the output Q. Similarly, at time T2, the flip-flop is reset and the complementary output !Q responds before the output Q. The flip-flop therefore provides the more desirable symmetrical switching behaviour which is advantageous in high speed logic circuits.

Figure 20:
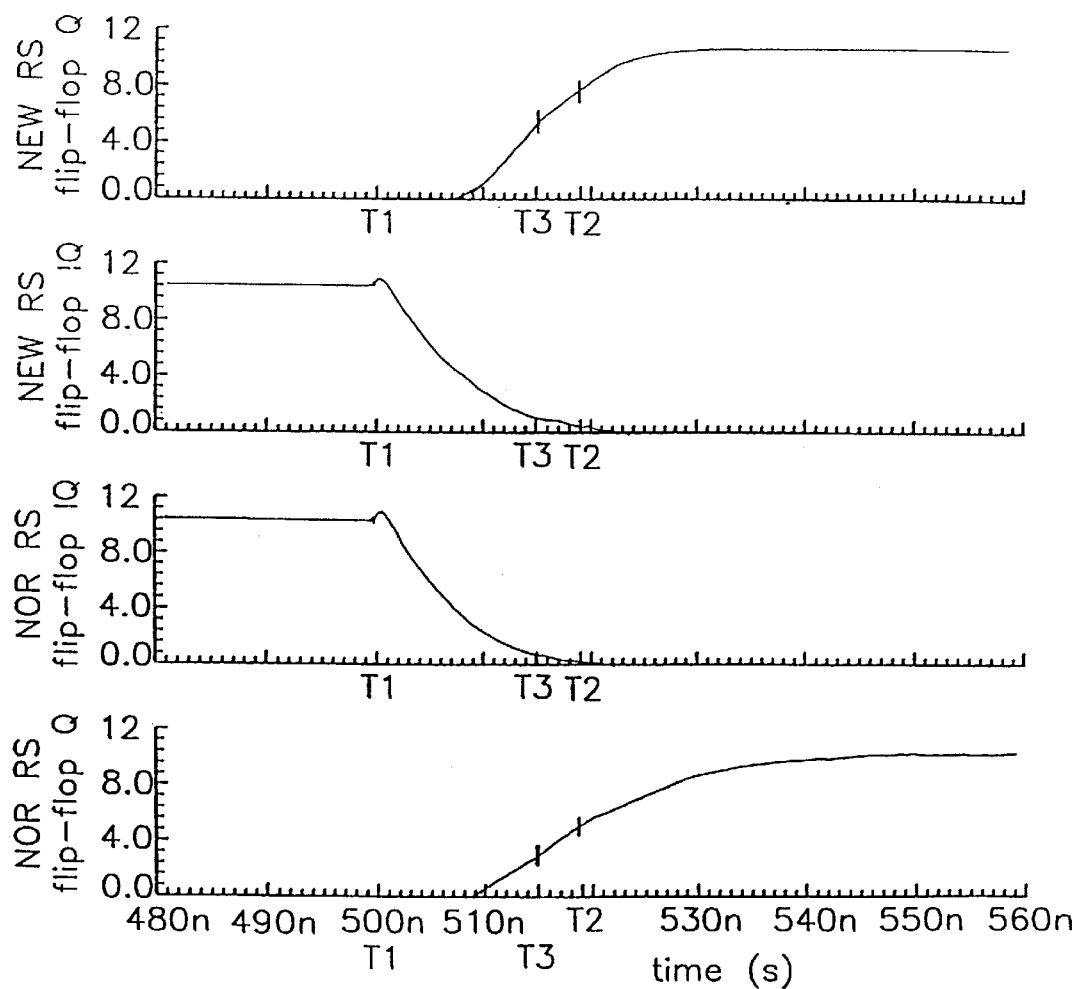
FIG. 20 is a timing diagram illustrating output waveforms of the flip-flops of FIGS. 15 and 18 during a set operation.
Figure 21:
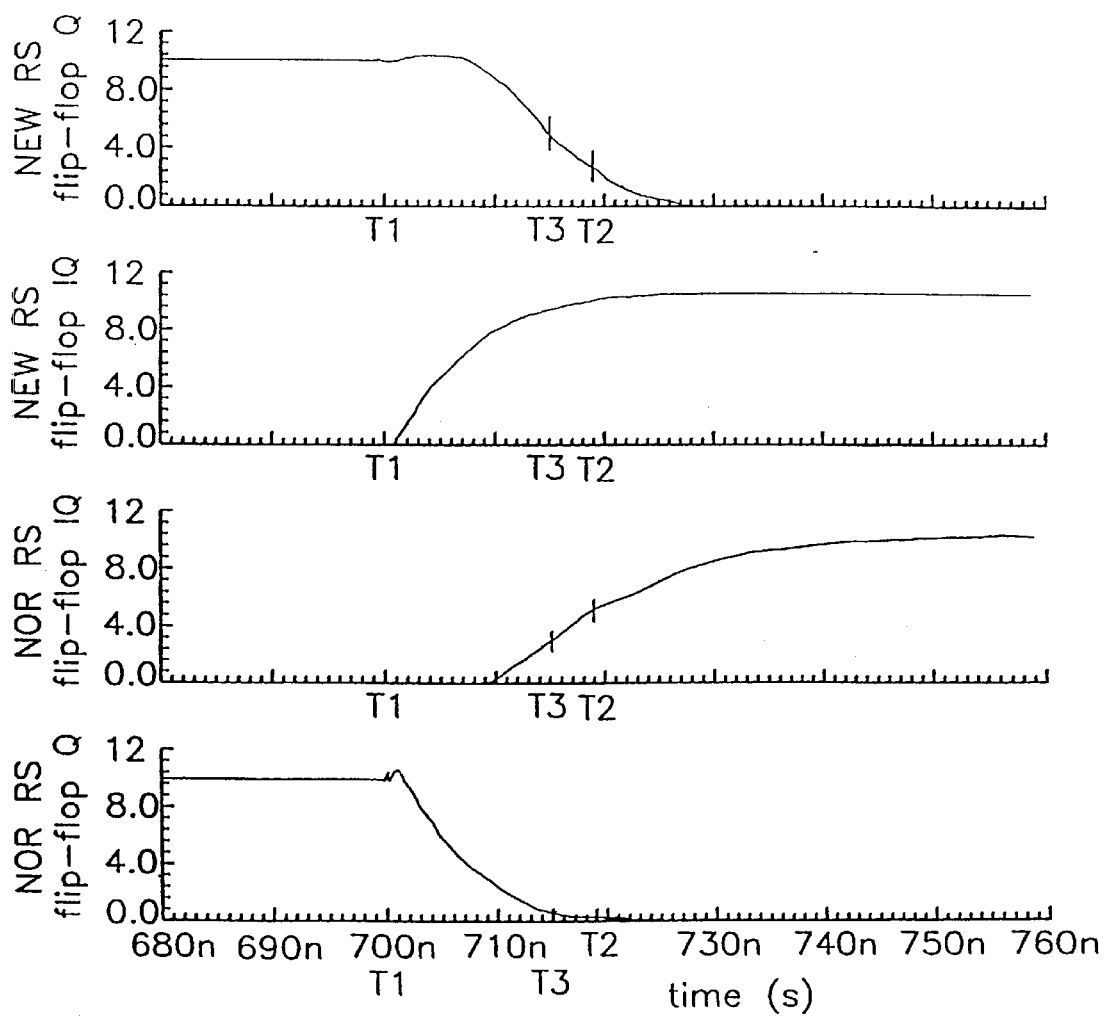
FIG. 21 is a timing diagram illustrating output waveforms of the flip-flops of FIGS. 15 and 18 during a reset operation.

FIGS. 20 and 21 compare the performance of the flip-flop of FIG. 18 with that of the flip-flop of FIG. 15 for set and reset transitions, respectively. These waveforms were obtained by simulation using the same parameters, namely equal-sized transistors of identical performance with each of the outputs driving a unit inverter load and the voltage waveforms being measured at the inputs of these inverters.

As shown in FIG. 20, the flip-flops are set at time T1. The outputs !Q of the "New RS flip-flop" of FIG. 18 and of the "NOR RS flip-flop" of FIG. 15 discharge at approximately the same rate. However, the speed of response of the outputs Q is substantially different. The output Q of the "new" flip-flop reaches the logic high state at a time T3, which is approximately 20% faster than the time taken for the output Q of the known circuit to reach the same logic level (at time T2).

As shown in FIG. 21, the flip-flops are reset at time T1. The output Q of the flip-flop of FIG. 15 and the output !Q of the flip-flop of FIG. 18 discharge and charge, respectively, at approximately the same rate. However, the output Q of the flip-flop of FIG. 18 reaches the logic low state at time T3 substantially faster than the output !Q of the flip-flop of FIG. 15 reaches the logic high state at time T2.

Figure 22:
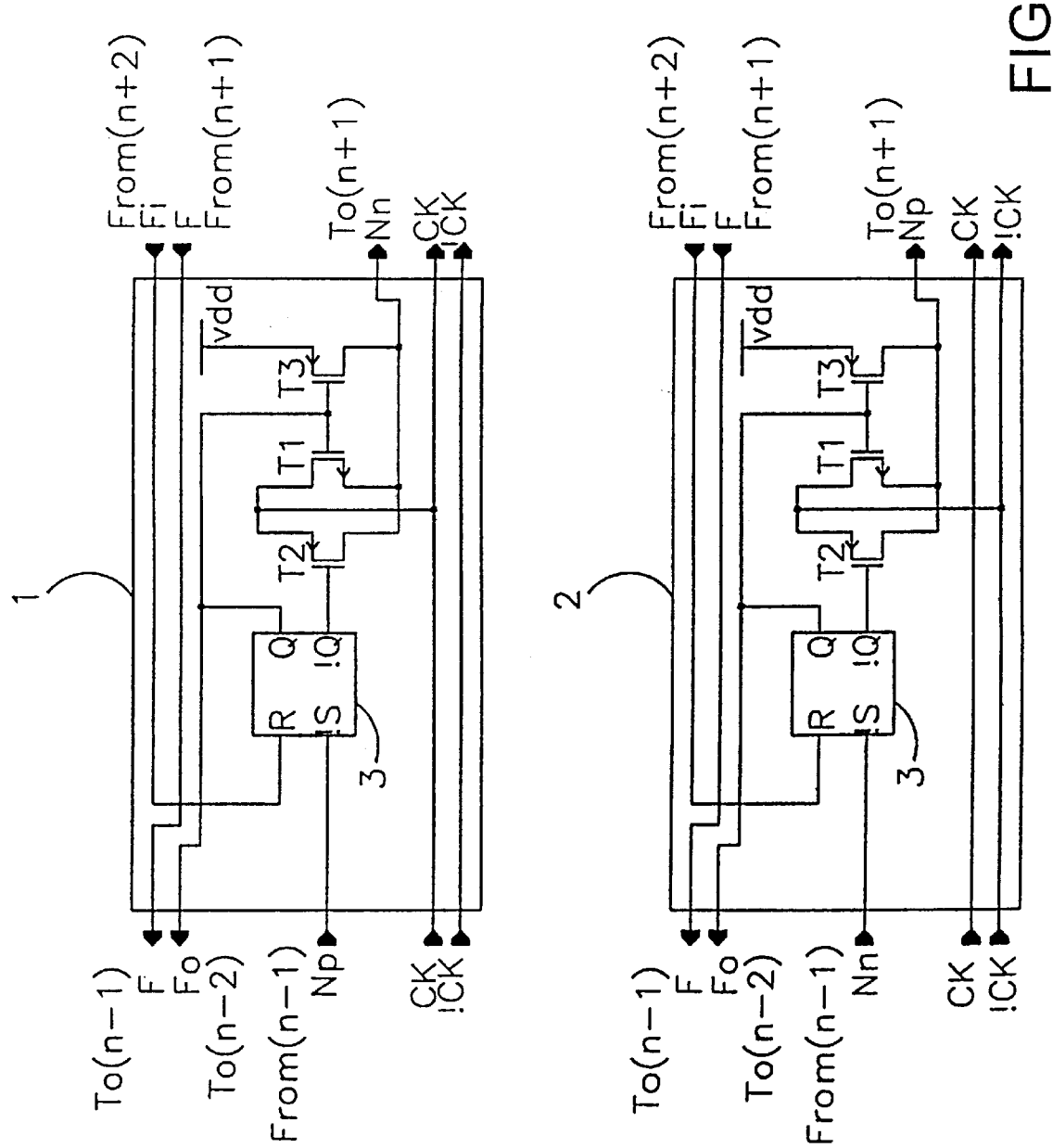
FIG. 22 is a circuit diagram of two stages of a static clock pulse generator constituting an embodiment of the invention.
Figure 23:
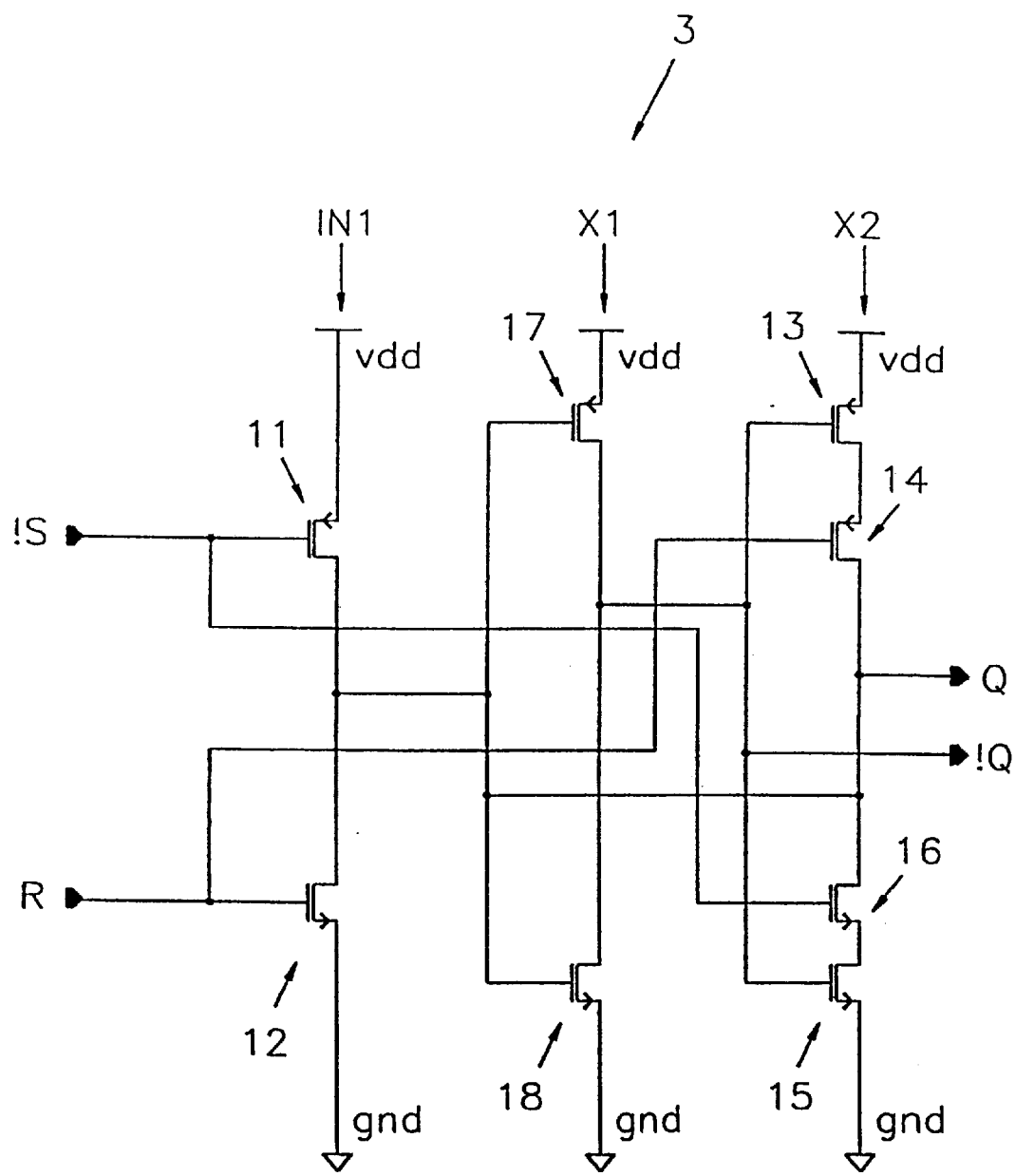
FIG. 23 is a circuit diagram of a reset-set flip-flop which may be used in the stages shown in FIG. 22.

FIG. 22 illustrates stages 1 and 2 which differ from those shown in FIG. 12 in that the inverters 6 are omitted and the flip-flops 3 have active low set inputs !S. These stages may make use of flip-flops having substantially the same architecture as illustrated in FIG. 18. A suitable flip-flop of this type is illustrated in FIG. 23, in which the inputs and outputs have been swapped. In this case, the gate of the first transistor 1 is connected to an active low set input !S whereas the gate of the second transistor 2 is connected to an active high reset input R. The output of the inverter X1 is connected to the complementary output !Q whereas the output of the inverter X2 is connected to the output Q. With this configuration, the transitions at the output Q always precede the corresponding transitions at the output !Q. Otherwise, the operation of the flip-flop of FIG. 23 is substantially the same as that of FIG. 18. The corresponding truth table for the flip-flop of FIG. 23 is as follows:

| !S | R | $Q_t$ | $!Q_t$ |
|---|---|---|---|
| 1 | 0 | $Q_{t-1}$ | $!Q_{t-1}$ |
| 1 | 1 | 0 | 1 |
| 0 | 0 | 1 | 0 |
| 0 | 1 | Undefined | |

Figure 24:
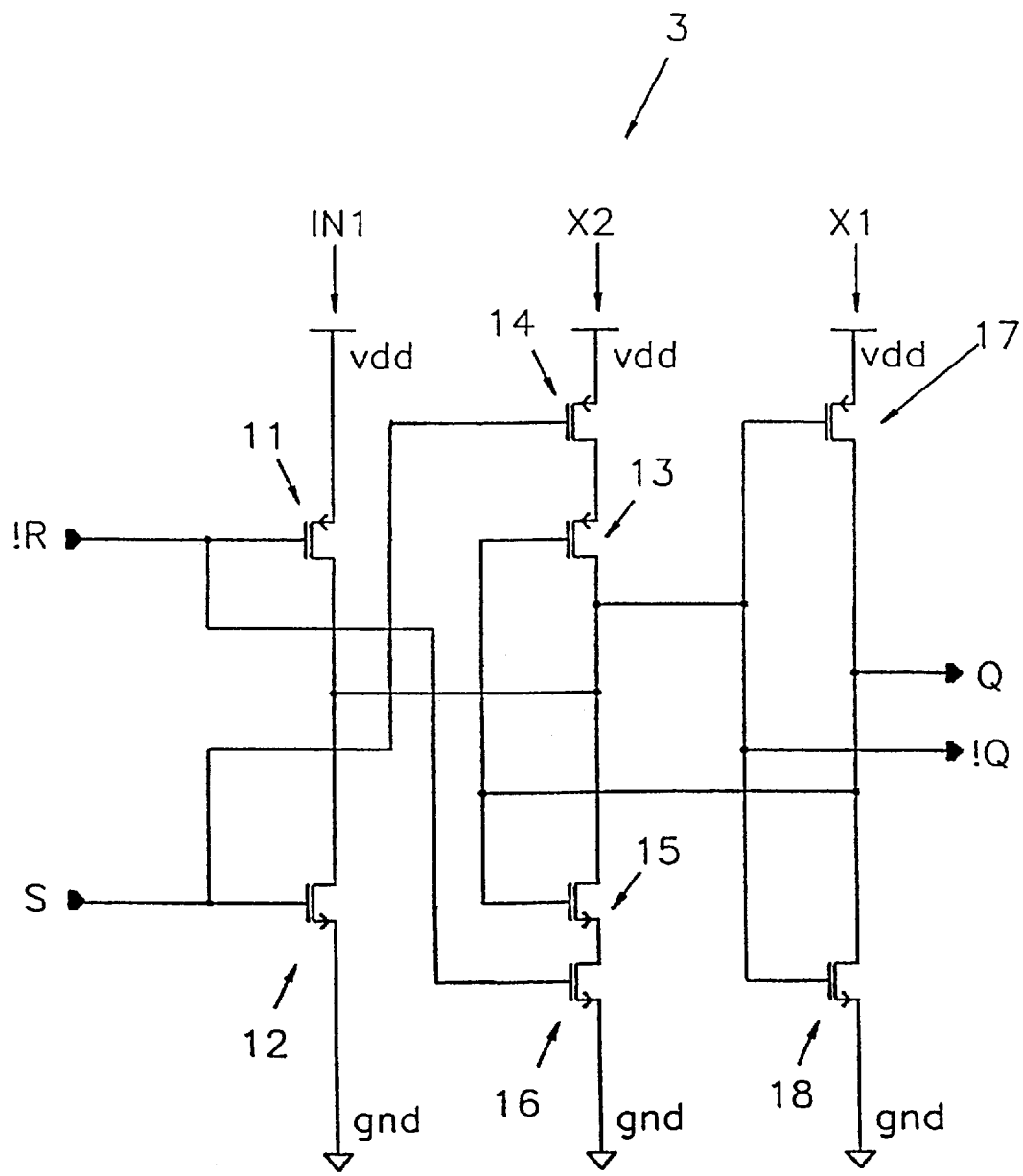
FIG. 24 is a circuit diagram of a modified flip-flop of the type shown in FIGS. 18 and 23.

The relative position of the transistors 13 and 14 and of the transistors 15 and 16 in the second inverter is not important to the correct operation of the flip-flop. For example, as shown in FIG. 24, the transistor 14 may be disposed between the first supply line vdd and the transistor 13 and the transistor 16 may be disposed between the second supply line gnd and the transistor 15. Also, pairs of transistors with their source-drain paths connected in series maybe replaced by multiple gate devices. For example, an shown in FIG. 25, the transistor 13 and 14 are replaced by a dual gate transistor D1 and the transistors 15 and 16 are replaced by a dual gate transistor D2.

Although the flip-flops described hereinbefore with reference to FIGS. 18 and 23 to 25 are intended to operate with standard logic level signals such that the logic level 1 signal has the value of the voltage on the first power supply line vdd and the logic level 0 signal has the voltage on the second supply line gnd, these embodiments are capable operating on lower voltage input signals and may therefore perform level shifting. For example, as shown in FIG. 26, the set input S is capable of responding to an active high set signal having a voltage of Vs which is less that the supply voltage vdd (relative to the ground potential). Similarly, the active low reset input !R of the embodiment of FIG. 18 is capable of responding to a reset signal whose voltage Vr is greater than the ground potential. For example, during a set operation of the flip-flop of FIG. 18, the transistor 12 can be turned on with a gate-source voltage which is less than the supply voltage. However, the transistor 14 may not be completely turned off because its gate-source voltage is equal to the difference between the supply voltage and the voltage of the set signal. There may therefore be n momentary conflict between the operation of the transistor 12 and the transistors 13 and 14 and, depending on the actual magnitude of the set signal and the threshold voltages of the transistors, the flip-flop may or may not change state.

The minimum value of the magnitude of the set signal required for the flip-flop to change state and become set may be increased by making the transistor 12 large in comparison to the transistors 13 and 14. This is the usual configuration for fast circuits with high drive capability outputs.

Figure 27:
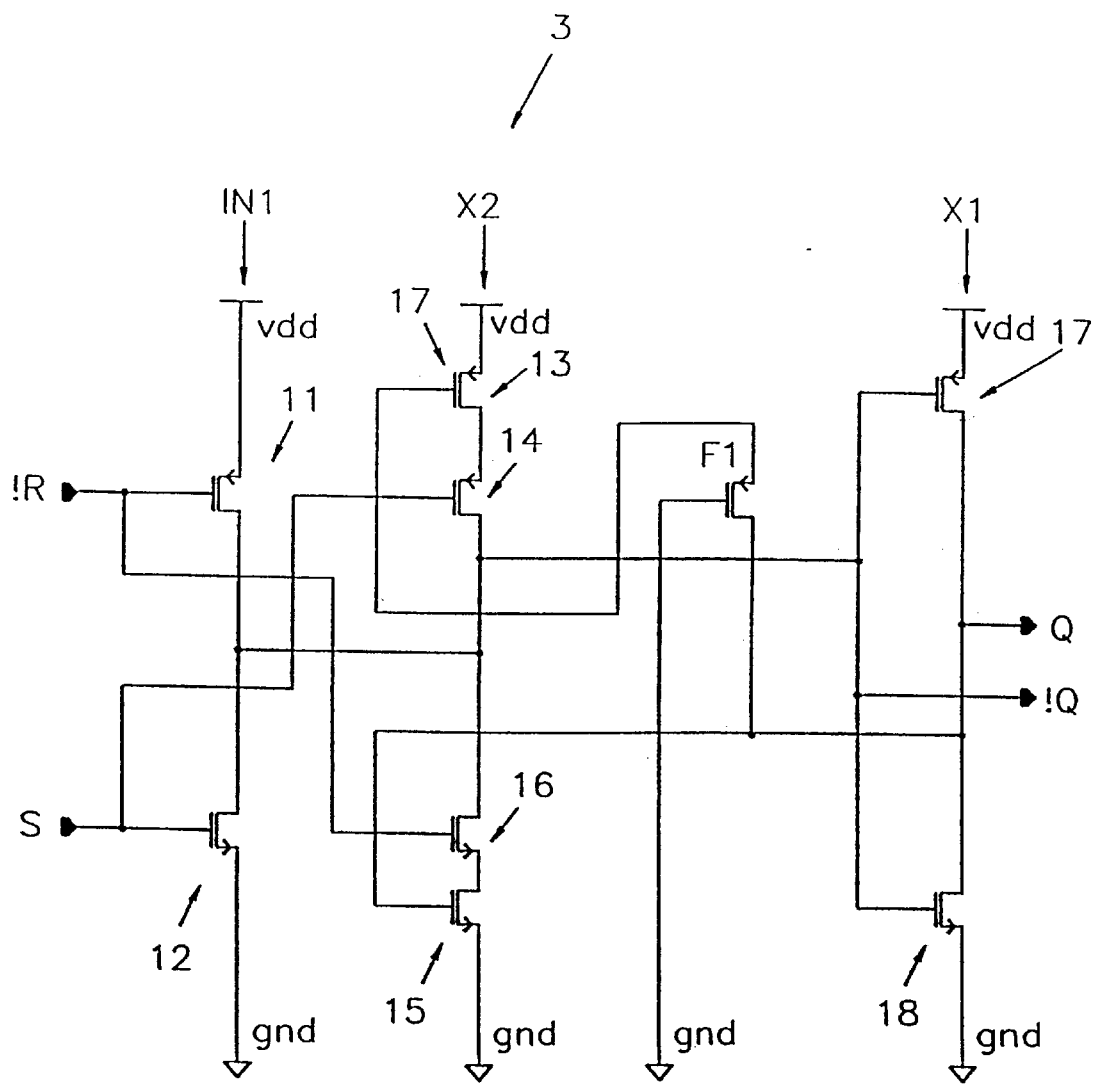
FIG. 27 is a circuit diagram of a flip-flop of the type shown in FIGS. 18 and 23 modified for low input voltage operation.

The flip-flop shown in FIG. 27 represents a modified version of that shown in FIG. 18 and is further optimised for low input voltage operation. A further P-type transistor F1 arranged as a pass transistor is connected between the output of the first inverter X1 and the gate of the transistor 13. The gate of the transistor F1 is connected to the second supply line gnd.

The operation of the flip-flop of FIG. 27 relies on the fact that the transistor F1 can only pass a logic level 0 degraded by a threshold voltage. Thus, following a reset operation, the condition of the flip-flop is such that the gate of the transistor 13 is at a potential close to the threshold voltage of the transistor F1. This ensures that the transistor 13 is only weakly turned on and that the combined pull-up drive of the transistors 13 and 14 is reduced. Consequently, during a subsequent setting operation, the flip-flop can be set with a lower input voltage Vs than could otherwise be achieved.

The same technique may be applied to increase the minimum active low resetting voltage. In this case, an N-type transistor arranged as a pass gate is connected between the output of the inverter X1 and the gate of the transistor 15 with its gate electrode connected to the first supply line vdd.

Figure 25:
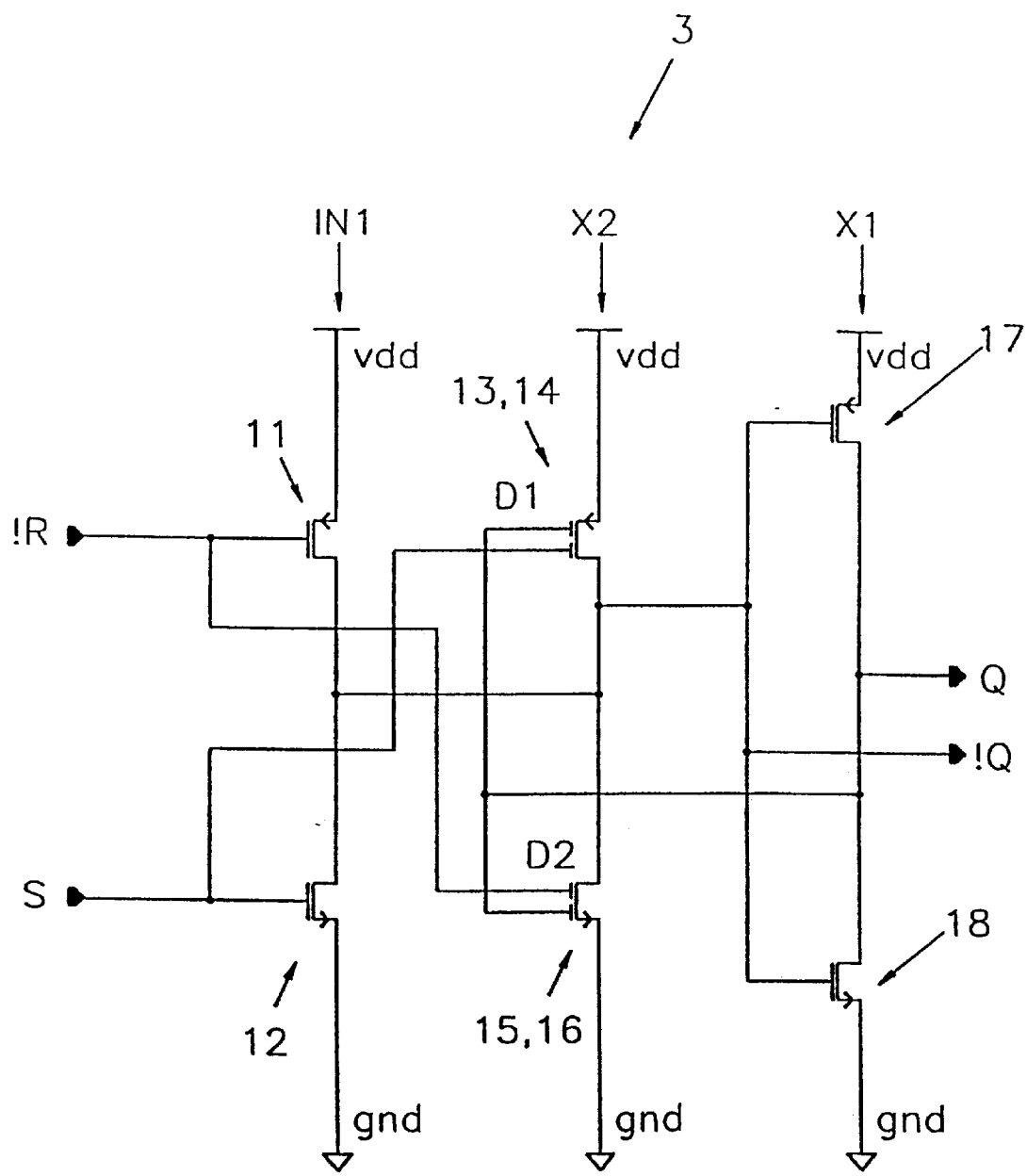
FIG. 25 is a circuit diagram of another modified flip-flop of the type shown in FIGS. 18 and 23.
Figure 26:
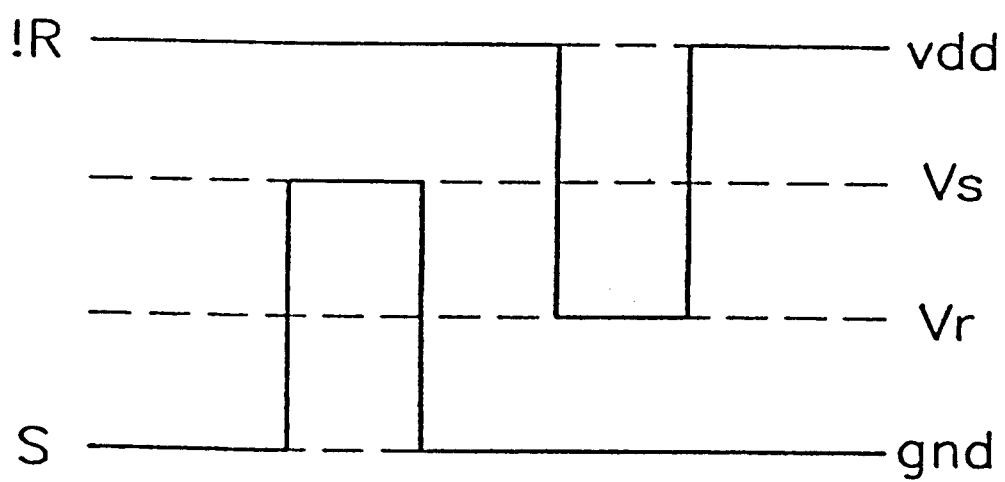
FIG. 26 is a diagram illustrating low input voltage operation.

The modifications illustrated in FIGS. 24, 25 and 27 may equally be applied to the flip-flops illustrated in FIGS. 18 and 23.

Figure 28:
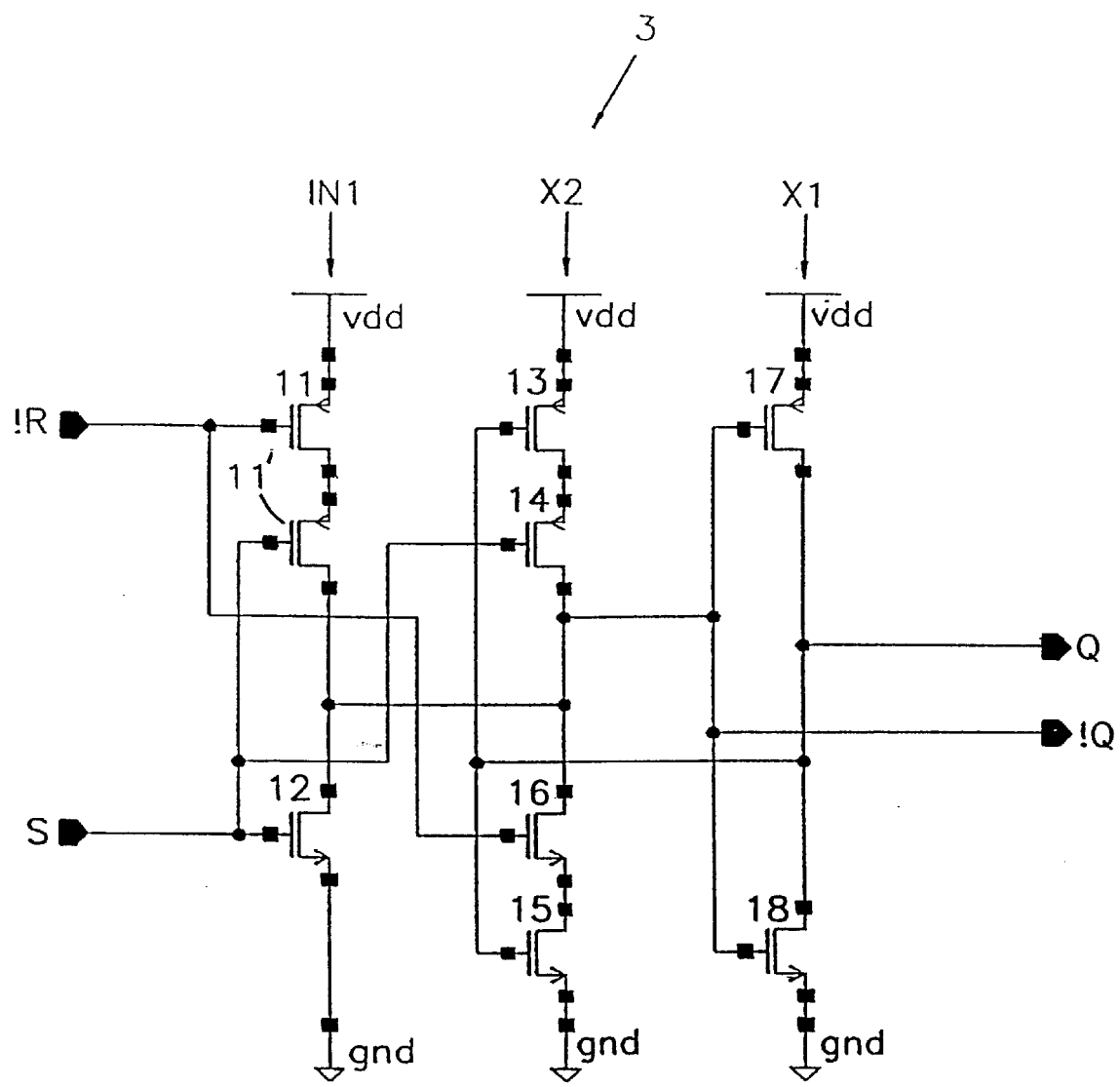
FIG. 28 is a circuit diagram of a flip-flop of the type shown in FIG. 18 modified for set-override operation.

The flip-flop shown in FIG. 28 is of a set-override type and differs from that shown in FIG. 18 in that a further transistor 11' is provided. The transistor 11' is of P-type and is connected in series with the transistor 11. The drain of the transistor 11 LiS connected to the source of the transistor 11', the drain of the transistor 11' is connected to the drain of the transistor 12 and the gate of the transistor 11' is connected to the set input S. Alternatively, the source-drain path of the transistor 11' may be connected between the source of the transistor 11 and the supply line vdd or the transistors 11 and 11' may be embodied as a dual gate transistor. L The operation of the flip-flop shown in FIG. 28 is similar to that shown in FIG. 18 but differs mainly in that there is no undefined state. The truth table for the flip-flop of FIG. 28 is as follows:

| S | !R | $Q_t$ | $!Q_t$ |
|---|---|---|---|
| 0 | 1 | $Q_{t-1}$ | $!Q_{t-1}$ |
| 0 | 0 | 0 | 1 |
| 1 | 1 | 1 | 0 |
| 1 | 0 | 1 | 0 |

The flip-flop of FIG. 18 has an undefined state when the set and reset inputs are both simultaneously active. However, the flip-flop of 28 is arranged to be set when the set and reset inputs are both simultaneously active. Thus, the set input S overrides the reset input !R in this situation as illustrated in the truth table. In particular, when the set input S is at logic level 1, the transistor 11' is turned off and disconnects the drain of the transistor 11 from the drain of the transistor 12 so that the flip-flop is forced into the set state. The use of the flip-flop of FIG. 28 in the static clock pulse generator has several advantages. Because there are no undefined states, it is impossible for the clock pulse generator to be trapped in an undefined state. Also, any spurious 1 states which occur within the clock pulse generator upon start-up are effectively removed when the generator is clocked so that it is unnecessary to provide a separate reset signal and associated circuitry for resetting the clock pulse generator upon start-up. Further, it is possible to transmit longer pulses through the clock pulse generator if required. Several consecutive start pulses can be supplied and these pulses will be clocked through the generator and will occupy consecutive stages.

Figure 29:
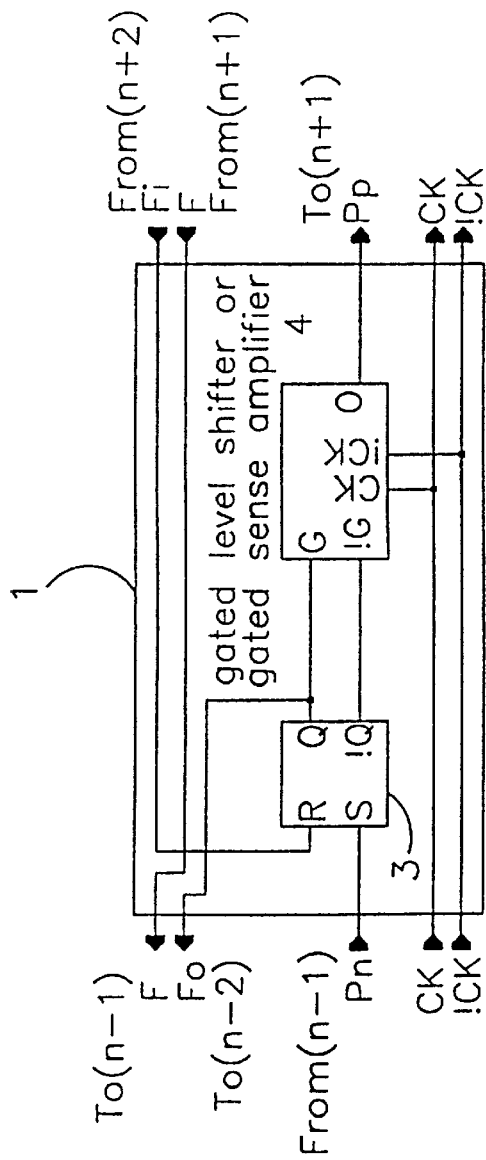
FIG. 29 is a circuit diagram of two stages of a static clock pulse generator constituting an embodiment of the invention.
Figure 29:
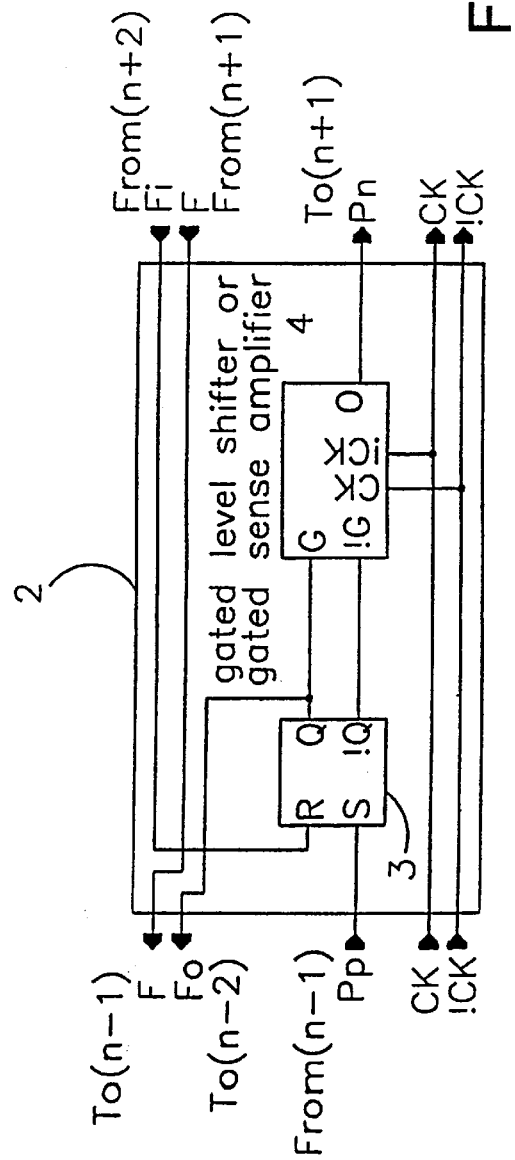

FIG. 29 illustrates modified stages 1 and 2 which employ an alternative technique for providing low voltage operation. This technique may be used with single phase or two phase clock signals of amplitudes substantially lower than the power supply voltage. The stages 1 and 2 shown in FIG. 29 differ from those shown in FIG. 4 in that each of the gating circuits 4 is embodied as a gated level-shifter or gated sense amplifier. Thus, the gating circuits performs voltage level-shifting of the clock pulses.

Figure 30:
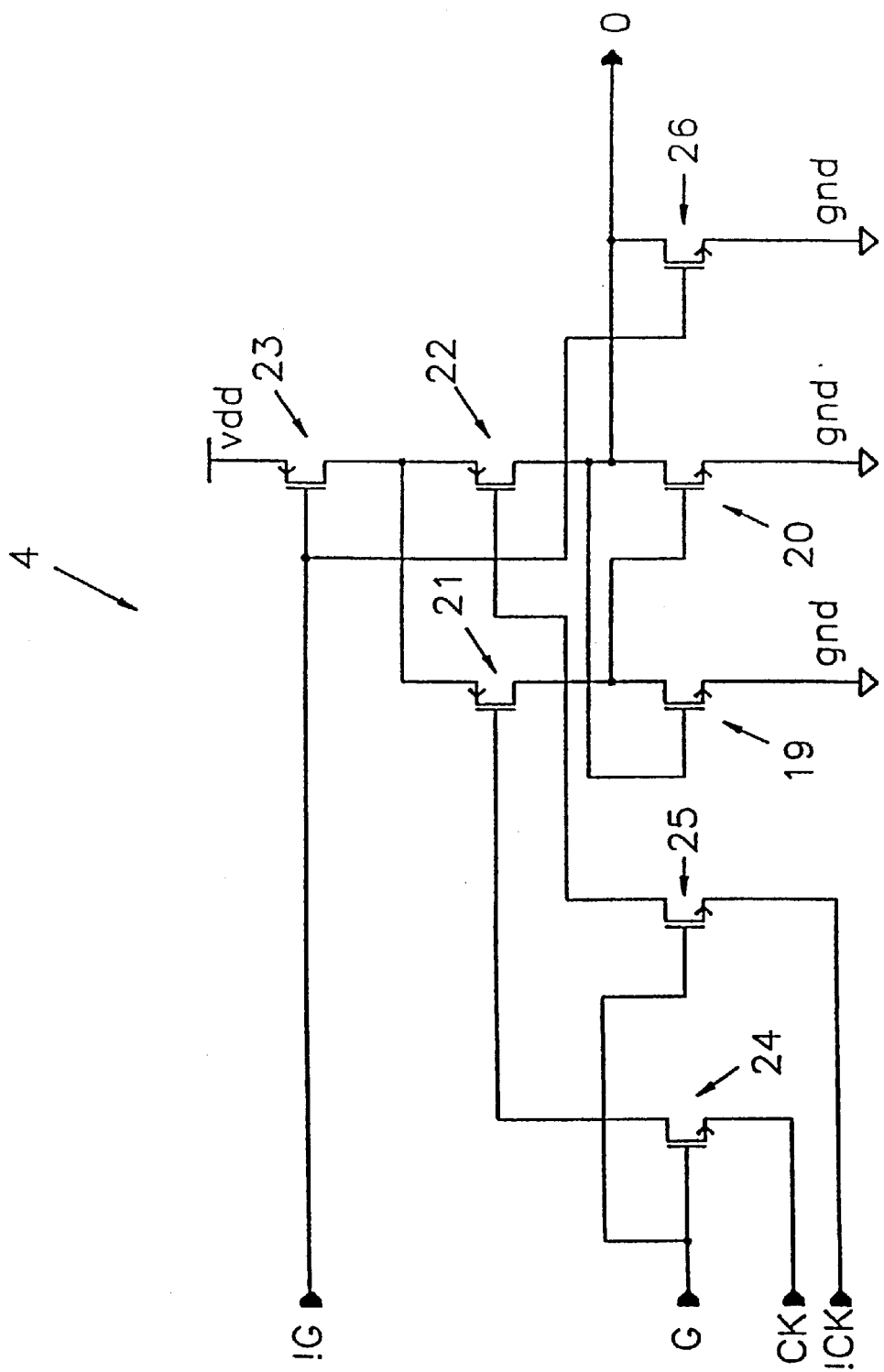
FIG. 30 is a circuit diagram of a gated sense amplifier which may be used in the stages shown in FIG. 29.

FIG. 30 illustrates in more detail a gated sense amplifier which may be used as the gating circuit 4. The amplifier comprises ninth and tenth N-type transistors 19 and 20 and eleventh to thirteenth P-type transistors 21 to 23 arranged as a cross-coupled sense amplifier, for instance of the type disclosed in A. Bellaouar and M. Elmasry, "low-power digital VLSI design circuits and systems", Kluwer Academic Publishers, 1995, the contents of which are incorporated heroin by reference. The sources of the transistors 19 and 20 are connected to ground whereas the drains thereof are connected to the drains of the transistors 21 and 22 and to the gates of the transistors 20 and 19, respectively. The sources of the transistors 21 and 22 are connected to the drain of the transistor 23 whose source is connected to the supply input vdd. The gate of the transistor 23 is connected to the complementary gate input !G.

The amplifier further comprises fourteenth to sixteenth N-type transistors 24 to 26. The sources of the transistors 24 and 25 are connected to the direct and complementary clock inputs CK and !CK whereas the gates thereof are connected together to the gate input G. The drains of the transistors 24 and 25 are connected to the gates of the transistors 21 and 22, respectively. The source-drain path of the transistor 26 is connected between the output O and ground gnd whereas the gate thereof is connected to the complementary gate input !G.

When the gated sense amplifier 4 is enabled such that the gating signals G and !G are high and low, respectively, the transistors 24 and 25 pass the clock signals to the gates of the transistors 21 and 22. The transistor 23 is grounded such that the sense amplifier operates with a high tail current. The transistor 26 is switched off so that the output O follows the logic state of the clock input CK with an appropriate level shift.

The amplifier is disabled when the signals G and !G are low and high, respectively, so that the transistors 24 and 25 isolate the clock inputs. The transistor 23 is turned off so as to stop current flow through the amplifier. The pull-down transistor 26 is turned on so that the output O is held at its default logic low state.

Figure 31:
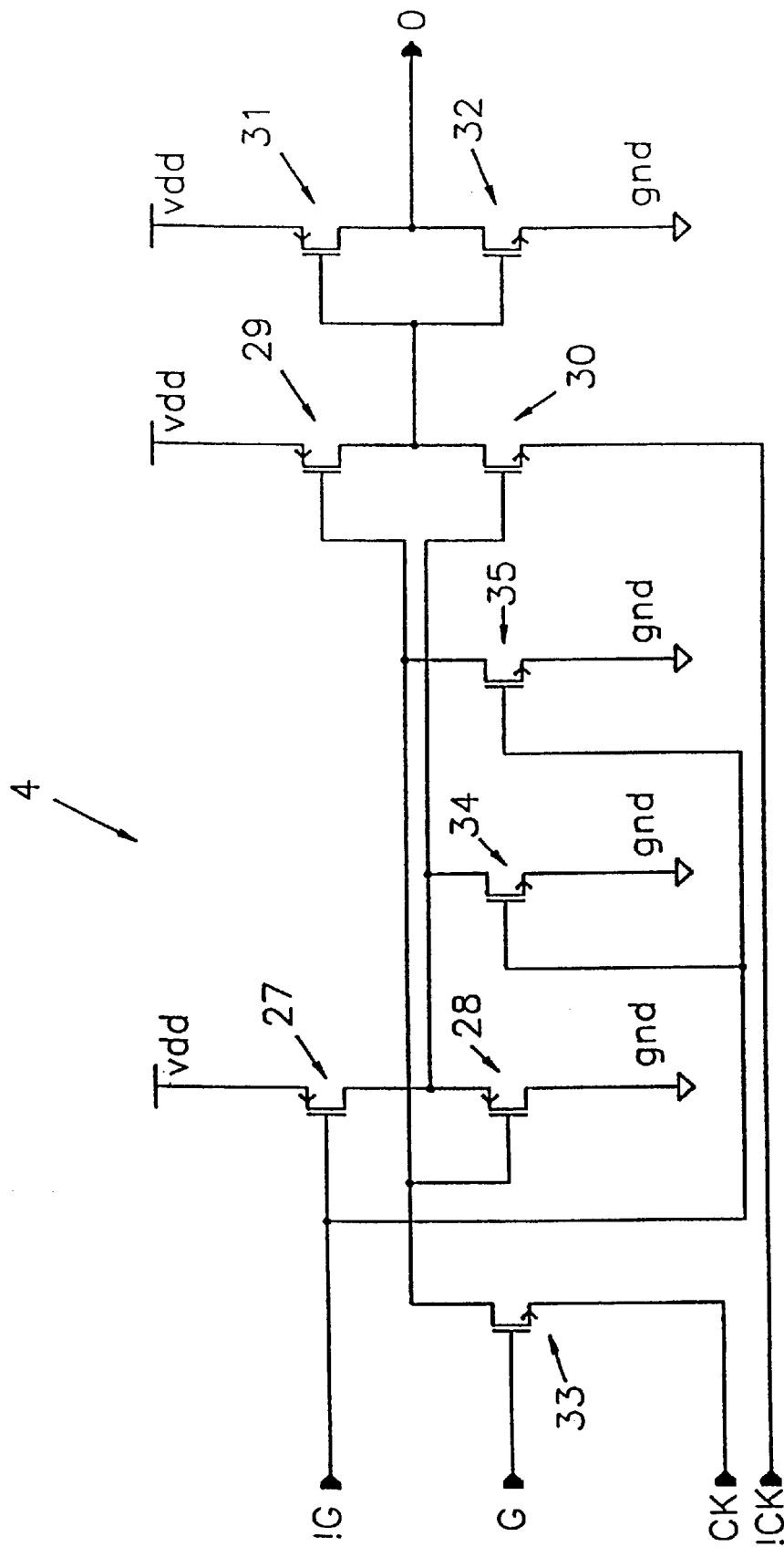
FIG. 31 is a circuit diagram of a gated differential voltage level shifter which may be used in the stages shown in FIG. 29.

FIG. 31 illustrates a gated level shifter which may be used as the gating circuit 4. The level shifter comprises seventeenth to nineteenth P-type transistors 27 to 29 and a twentieth N-type transistor 30. The sources of the transistors 27 and 29 are connected to the power supply input vdd. The gate of the transistor 27 is connected to the complementary gate input !G whereas the drain thereof is connected to the source of the transistor 28. The drain of the transistor 28 is connected to ground. The drain of the transistor 29 is connected to the drain of the transistor 30, whose source is connected to the complementary clock input !CX and whose gate is connected t6 the source of the transistor 28.

The drains of the transistors 29 and 30 are connected to the gate of a twenty first P-type transistor 31 and a twenty second N-type transistor 32. The sources of the transistors 31 and 32 are connected to the power supply inputs vdd and gnd, respectively, whereas the drains thereof are connected together and to the output O.

A twenty third N-type transistor 33 has a drain connected to the gates of the transistors 28 and 29, a source connected to the clock input CK and a gate connected to the gate input G. Twenty fourth and twenty fifth N-type transistors 34 and 35 have gates connected to the complementary gate input !G, sources connected to ground gnd, and drains connected to the gates of the transistors 30 and 29, respectively.

When the level shifter iso enabled by high and low gating signals G and !G, respectively, the transistor 33 passes the clock signals to the gates of the transistors 29 and 30. The transistors 27 and 28 operate as a source follower with the transistor 27 switched hard on so as to provide maximum boost to the input signal. The transistors 34 and 35 are switched off and the circuit operates as a differential input level shifter so that the output O follows the logic state of the clock phase CK.

When the level shifter is disabled by low and high inputs G and !G, respectively, the transistors 34 and 35 are turned on so as to ensure that the transistor 30 is turned off, the transistor 29 is turned on and the output of the inverter formed by the transistors 31 and 32 is held low. The transistor 33 isolates the clock phase CK.

In the arrangements shown in FIGS. 29 and 30, the clock phases CK and !CK do not drive transistor gates directly but instead are gated by the transistors 24, 25, 30 and 33 which act as pass gates.

FIG. 32 illustrates a stage 1 of the type shown in FIG. 11 modified for bi-directional operation. The upper part of FIG. 32 illustrates the configuration for generating pulses in sequence from left to right whereas the lower part of FIG. 32 illustrates the configuration for generating pulses in sequence from right to left. Similar modifications maybe made in the other types of stages described hereinbefore.

The modification comprises providing electronic switches 7 and 8, for instance in the form of transmission gates, for controlling the directions in which set and reset pulses are passed from stage to stage. Thus, the stage 1 has left and right feed back connections Fo which are selectively connected to the output Q of the flip-flop by the switch 7. Similarly, the stage has left and right outputs Pp for set pulses supplied from the output of the transmission gate T1, T2 in accordance with the position of the switch 8. As shown in the upper part of FIG. 32, for operation from left to right, the switch 7 directs reset pulses from the output Q of the flip-flop to the left and via the preceding stage to the stage before the preceding stage where such pulses are used to reset the flit-flop. The output pulses from the transmission gate T1, T2 are supplied to the succeeding stage for setting the flip-flop thereof.

As shown in the lower part of FIG. 32, operation from right to left occurs when the switches 7 and n are in their alternative positions. In this case, the reset pulses from the output Q of the flip-flop are supplied to the right via the following stage to the stage after the following stage for resetting the flip-flop thereof. The switch 8 directs the output signal to the left to the preceding stage for setting the flip-flop thereof.

FIG. 33 illustrates a bi-directional stage 1 similar to that shown in FIG. 32 but modified so as to reduce the number of signals which have to be routed between stages. The stage of FIG. 33 differs from that of FIG. 32 in that the left and right feedback connections Fo are selectively connected by the switch 7 to the output of the transmission gate comprising the transistors T1 and T2. This allows the two signal paths F of the stages shown in FIG. 32 to be omitted.

FIG. 34 illustrates another bi-directional stage 1 in which the signal routing between stages is reduced even further. In this case, the set input S is selectively connected vin the switch 7 to receive a pulse Pn from a preceding or succeeding stage whereas the reset input R of the flip-flop 3 is selectively connected via the switch 8 to receive a pulse Pn from a succeeding or preceding stage, respectively.

FIG. 35 illustrates the penultimate right hand stage 2 connected to a final stage 100 of a clock signal generator. In left-to-right operation as illustrated in FIG. 35, the clock pulse transmitted by the final stage 100 resets that stage and also the penultimate stage. During right-to-left operation, the switches 7 and 8 are changed over so that the flip-flop 3 of the final stage 100 in set by a start pulse SP. The clock pulse transmitted by this stage sets the flip-flop 3 of the penultimate stage 2 and the subsequent clock pulse passed by the penultimate stage 2 sets the flip-flop of the antepenultimate or preceding stage (1) (now shown) and resets the flip-flop of the final stage 100.

The final stage 100 may be used in place of a pair of stages 1, 2, whose complexity is not needed. The stage 100 may also be used as the first stage of a bi-directional static clock pulse generator. In the case of a mono-directional static clock pulse generator, the first and last stages may be of the type shown at 100 in FIG. 35 but with the switches 7 and 8 replaced by the appropriate hard-wiring according to whether the stage is to be used as the first stage or the last stage of the generator.

FIG. 36 illustrates a bi-directional stage of the type shown in FIG. 32 but rearranged slightly for use with flip-flops 3 of the type shown in FIG. 25. The switch 7 is embodied by two transmission gates formed by transistors B1 to B4 whereas the switch 8 is embodied by transmission gates formed by transistors B5 to B8. The direction of operation is controlled by direction control signals on lines L and !L. The output of the stage is indicated at S_O.

The transistors B1, B2, B7 and B8 are turned on and the transistors B3. B4, B5 and B6 are turned off for operation from left to right. Conversely, the transistors B3, B4, B5 and B6 are turned on and the transistors B1, B2, B7 and B8 are turned off for operation from right to left. The transmission gates B5, B6 and B7, B8 supply the clock pulse output to output terminals QR and QL, respectively, depending on the direction of operation. The transmission gates B1, B2 and B3, B4 pass the signal from the complementary output. !Q to the stage two places to the left or right, respectively, in order to reset the flip-flop thereof at the appropriate time. A reset transistor R1 is connected between a supply line vdd and the drains of the transistors 11 and 12 and has a gate connected to a reset line RESET. This arrangement ensures that all of the flip-flops of the stages are reset in response to a single signal, for instance when power is supplied to the generator. The various inputs and outputs D, FRL, F, FLR, FL and FR provide routing between stages for the various signals.

The stage 1 shown in FIG. 36 is of the type which provides positive output pulses Pp synchronized with the rising edge of the clock signals CK. A stage 2 for providing positive output pulses Pn synchronised with the rising edge of the complementary clock signal !CK differs from the stage shown in FIG. 36 in that the input of the transmission gate T1, T2 is connected to the complementary clock line !CK.

FIG. 37 illustrates a static clock pulse generator comprising stages of this type arranged in cascade. This drawing illustrates the interconnections between consecutive stages. In addition to a start pulse SPL for operation from left to right, a start pulse SPR is required for the Nth stage for operation from right to left. Direction control lines L and !L receive complementary signals for determining whether operation is from left to right or from right to left. A common reset line receives a common reset signal RESET for resetting the flip-flops 3 of all of the stages before commencing operation.

When stages of the type shown in FIG. 36 are operated with low voltage clock inputs, several of the transistors are redundant and may be omitted. For example, if the clock pulses are of much lower voltage than the power supply voltage, the P-type device T2 is superfluous and the N-type device T1 can easily pass the lower voltage signal. If the clock signals swing between gnd and vdd supply lines, the device T1 can only pass a logic high state degraded by its threshold voltage to the transistors 11 and 12 of the succeeding stage. However, because the flip-flop devices can be optimised, the flip-flop may still be set with such a signal. If the transistor T2 is omitted, the P-type devices B5 and B7 are not required.

The feedback signal passed by the transmission gates B1, B2 and B3, B4 is a negative going pulse. All transistors may not be needed because the P-type devices B1 and B3 can pass the logic low signal, possibly with acceptable degradation, sufficiently well to force resetting of the flip-flop.

FIG. 38 shows in more detail a stage similar to that shown in FIG. 34 and using a flip flop similar to that shown in FIG. 28. The flip-flop of FIG. 38 differs from that of FIG. 28 in that it has an active high reset input R and an active low set input !S. An inverter comprising transistors 50 and 51 is connected between the active low set input and the switch 7 comprising transistors B1, B2, B5 and B6 so as to allow the flip-flop to be used in the configuration shown in FIG. 34, which requires a flip-flop with active high inputs R and S. The switch 8 comprises transistors B3, B4, B7 and B8.

The flip-flop shown in FIG. 38 differs from that shown in FIG. 28 in that the transistors 13 to 16 are replaced by dual gate transistors D1 and D2. Also, the transistor 11' is omitted and the transistor 12 is replaced by a dual gate transistor 12' whose gates are connected to the inputs R and !S. The flip-flop thus functions as a set-override reset-set flip-flop with an active high reset input R and an active low set input !S. FIGS. 39a and 39b illustrate another type of bi-directional stage for a static clock pulse generator. This stage comprises a flip-flop formed by transistors 11 to 18 as shown in FIG. 25 and a gated level shifter formed by transistors 27 to 35 as shown in FIG. 31. The transmission gate transistors B1 to B8 correspond to and perform the same functions as the transistors B1 to B8 shown in FIG. 36. Transistors D1 to D6 form a delay circuit of the type illustrated in at 5 in FIG. 9 so as to ensure that the outputs S_O of every other stage do not overlap. A reset transistor R1 as shown in FIG. 36 is also provided. This stage is shown as providing output signals S_O and S_O2, either or both of which may be used depending on the circuit application.

The stage illustrated in FIGS. 39a and 39b provides positive pulses Pp synchronised with the positive-going pulses of the clock signal CK. However, in order to provide positive pulses Pn coinciding with the negative-going pulses of the clock signal CK, it is merely necessary to swap the clock input connections CK and !CK.

The static clock pulse generator may be embodied as or as part of a CMOS integrated circuit. For use in a picture element (pixel) matrix display, such a generator may be implemented in LSI (large scale integration) driver integrated circuits or on the display substrate using any suitable silicon-on-insulator technology.

FIG. 40 illustrates a display comprising a display matrix 40 of N rows by M columns of pixels, for instance in the form of a spatial light modulator comprising a liquid crystal device. The display further comprises an address signal generator 41 comprising a clock pulse generating circuit 42 and a set of data line drivers 43. The clock pulse generating circuit 42 comprises a generator of any of the types described hereinbefore and illustrated in. FIGS. 4 to 39b. A scan signal generator 44 supplies scan signals to the rows of pixels and comprises a clock pulse generating circuit 45 and a set of scan line drivers 46. The clock pulse generating circuit 45 comprises a generator of any of the types described hereinbefore and illustrated in FIGS. 4 to 39b. The clock pulse generating circuits generate clock pulses at pixel data rate for the circuit 42 and at line data rate for the circuit 45.

What is claimed is:

1. A static clock pulse generator comprising a clock input and N stages, wherein each ith one of the stages comprises a reset-set flip-flop having a set input for receiving a set signal from a gating circuit of the (i−1)th stage and a reset input for receiving a reset signal from an (i+a)th stage, where a is greater than or equal to one, and a gating circuit for passing a clock pulse from at least one clock signal input of the gating circuit connected to the clock input to an output of the gating circuit when the flip-flop is set, where 1<i≦ (N−a), wherein the or each clock signal input of each gating circuit is connected exclusively, within the gating circuit, to a terminal of the main conduction path of a pass gate of the gating circuit.

2. A generator as claimed in claim 1, wherein the gating circuit is arranged to hold the output of the gating circuit at an inactive state when the flip-flop is reset.

3. A generator as claimed in claim 1, wherein the reset input of the flip-flop of each ith stage is arranged to receive the reset signal from an output of the flip-flop of the (1+2)th stage.

4. A generator as claimed in claim 1, wherein the reset input of the flip-flop of each ith stage is arranged to receive the reset signal from the output of the gating circuit of the (i+1)th stage.

5. A generator as claimed in claim 1, wherein the output of the gating circuit of each ith stage is connected to the set input of the flip-flop of the (i+1)th stage via a delay circuit.

6. A generator as claimed in claim 5, wherein each delay circuit comprises a plurality of cascade-connected inverters.

7. A generator as claimed in claim 1, further comprising a first stage comprising a reset-set flip-flop having a set input for receiving a start pulse and a reset input for receiving a reset signal from the (i+a)th stage, and a gating circuit for passing a clock pulse from the clock input to the second stage when the flip-flop is set.

8. A generator a claimed in claim 7, wherein the first stage comprises a second switching arrangement for selectively causing the flip-flop set input to receive a set input signal from the gating circuit output of the second stage and the flip-flop reset input to receive a clock pulse from the gating circuit of the first stage.

9. A generator as claimed in claim 1, further comprising a Nth stage comprising a reset-set flip-flop having a set input for receiving a set signal from the gating circuit output of the (N−1)th stage and a reset input, and a gating circuit for passing a clock pulse from the clock input to the reset inputs of the flip-flops of the Nth and (N−1)th stages.

10. A generator as claimed in claim 9, wherein the Nth stage comprises a third switching arrangement for selectively causing the flip-flop set input to receive a start pulse and the flip-flop reset input to receive a reset signal from the (N−1)th stage.

11. A generator as claimed in claim 1, wherein each ith stage comprises a first switching arrangement for selectively causing the flip-flop set input to receive a set signal from the gating circuit of the (i+1)th stage and the flip-flop reset input to receive a reset signal from the (i−a)th stage.

12. A generator as claimed in claim 1, in which at least some of the gating circuit outputs constitute outputs of the generator.

13. A generator as claimed in claim 1, wherein at least some of the outputs of the flip-flops constitute outputs of the generator.

14. A generator as claimed in claim 1, wherein each of the gating circuits comprises a pass gate and a holding device for holding the output of the pass gate at an inactive state when the flip-flop is reset.

15. A generator as claimed in claim 14, wherein each of the pass gates is a transmission gate comprising opposite conductivity metal-oxide-silicon field effect transistors whose source-drain paths are connected in antiparallel and whose gates are connected to direct and complementary outputs of the flip-flop.

16. A generator as claimed in claim 14, wherein the clock pulses passed by the pass gates of consecutive stages are of opposite polarity.

17. A generator as claimed in claim 16, wherein the holding devices of the stages comprise alternating pull-down and pull-up transistors, the control electrode of each pull-down transistor being connected to the complementary output of the associated flip-flop and the control electrode of each pull-up transistor being connected to the direct output of the associated flip-flop.

18. A generator as claimed in claim 1, wherein the clock input is a two phase clock input.

19. A generator as claimed in claim 1, wherein the pass gate inputs of consecutive stages are connected to different clock input phases.

20. A generator as claimed in claim 19, wherein the clock pulses passed by the pass gates of the stages are of the same polarity.

21. A generator as claimed in claim 20, wherein the holding device of each stage comprises a pull-down transistor whose control electrode is connected to a complementary output of the flip-flop.

22. A generator as claimed in claim 20, wherein the holding device of each stage comprises a pull-up transistor whose control electrode is connected to a direct output of the flip-flop.

23. A generator as claimed in claim 1, wherein the clock input is a single phase clock input.

24. A generator as claimed in claim 1, wherein each of the gating circuits comprises a gated sense amplifier, including the or each pass gate.

25. A generator as claimed in claim 1, wherein each of the gating circuits comprises a gated level shifter, including the or each pass gate.

26. A generator as claimed in claim 1, wherein each of the flip-flops comprises: a first inverter, at least one of whose input and output constitutes an output of the flip-flop; a second controllable inverter, whose input and output are connected to the output and input, respectively, of the first inverter; and an input circuit having first and second inputs constituting inputs of the flip-flop, the input circuit being arranged to supply to the input of the first inverter a signal corresponding to the states of the first and second inputs and to control the second inverter so as to switch the output of the second inverter to a high impedance state when the first or second input receives an active signal.

27. A generator as claimed in claim 26, wherein the first input in an active high input and the second input is an active low input.

28. A generator as claimed in claim 27, wherein the input circuit comprises: a first active device connected between a first power supply input and the input of the first inverter and having a control electrode constituting the second input; and a second active device, of opposite conduction type to the first active device, connected between a second power supply input and the input of the first inverter and having a control electrode constituting the first input.

29. A generator as claimed in claim 28, wherein each of the first and second active devices is connected in an inverting configuration.

30. A generator as claimed in claim 28, wherein the input circuit comprises a further active device of the same conductivity type as and connected in series with one of the first and second active devices and having a control electrode connected to the control electrode of the other of the first and second active devices.

31. A generator as claimed in claim 27, wherein the second inverter comprises third and fourth active devices of a first conduction type connected in series between a first power supply input and the output of the second inverter and fifth and sixth active devices of a second conductive type opposite the first type connected in series between a second power supply input and the output of the second inverter, the third and fifth active devices having control electrodes connected to the input of the second inverter and the fourth and sixth active devices having control electrodes connected to the first and second inputs, respectively, of the input circuit.

32. A generator as claimed in claim 31, wherein the control electrode of at least one of the third and fifth active devices is connected to the input of the second inverter via a further active device.

33. A generator as claimed in claim 32, wherein the or each further active device has a control electrode connected to the first or second power supply input.

34. A generator as claimed in claim 26, wherein the first inverter comprises a seventh active device connected between a first power supply input and the output of the first inverter and an eighth active device, of opposite conduction type to the seventh active device, connected between a second power supply input and the output of the first inverter, the seventh and eighth active devices having control electrodes connected to the input of the first inverter.

35. A generator comprising a clock input and N stages, wherein each ith one of the stages includes a reset-set flip-flop having a set input for receiving a set signal from a gating circuit output of the (i−1)th stage and a reset input for receiving a reset signal from an (i+a)th stage, where a is greater than or equal to one, and a gating circuit for passing a clock pulse from the clock input to an output of the gating circuit when the flip-flop is set, where 1<i≦(N−a), wherein the or each clock signal input of each gating circuit is connected exclusively, within the gating circuit, to a terminal of the main conduction path of a pass gate of the gating circuit, and further comprising a CMOS integrated circuit.

36. A spatial light modulator, comprising a static clock pulse generator including a clock input and N stages, wherein each ith one of the stages includes a reset-set flip-flop having a set input for receiving a set signal from a gating circuit output of the (i−1)th stage and a reset input for receiving a reset signal from an (i+a)th stage, where a is greater than or equal to one, and a gating circuit for passing a clock pulse from the clock input to an output of the gating circuit-when the flip-flop is set, where $1<i\leq(N-a)$, wherein the or each clock signal input of each gating circuit is connected exclusively, within the gating circuit, to a terminal of the main conduction path of a pass gate of the gating circuit.

37. A modulator as claimed in claim 36, further comprising a liquid crystal device.

38. A display further comprising a modulator as claimed in claim 36.

* * * * *